(12) United States Patent
Jones et al.

(10) Patent No.: US 7,340,671 B2
(45) Date of Patent: Mar. 4, 2008

(54) DECODING LOW DENSITY PARITY CODES

(75) Inventors: Christopher R. Jones, Pacific Palisades, CA (US); John D. Villasenor, Santa Monica, CA (US)

(73) Assignee: Regents of the University of California, Oakland, CA (US)

( * ) Notice: Subject to any disclaimer, the term of this patent is extended or adjusted under 35 U.S.C. 154(b) by 479 days.

(21) Appl. No.: 10/961,132

(22) Filed: Oct. 8, 2004

(65) Prior Publication Data

US 2005/0081128 A1 Apr. 14, 2005

Related U.S. Application Data

(60) Provisional application No. 60/510,183, filed on Oct. 10, 2003.

(51) Int. Cl.
*G06F 11/00* (2006.01)

(52) U.S. Cl. .................................... 714/800
(58) Field of Classification Search ................. 714/800
See application file for complete search history.

(56) References Cited

U.S. PATENT DOCUMENTS

| 6,633,856 | B2 | 10/2003 | Richardson | |
|---|---|---|---|---|
| 6,938,196 | B2 | 8/2005 | Richardson | |
| 7,137,060 | B2 * | 11/2006 | Yu et al. ..................... | 714/794 |

OTHER PUBLICATIONS

R.G. Gallagher, "Low-density parity-check codes," IRE Trans. Inform. Theory, vol. IT-8, pp. 21 28, Jan. 1962.

C. Berrou, A. Glavieux, and P. Thilimajshima, "Near Shannon limit error-correcting coding and decoding: Turbo codes," in Proc. IEEE Int. Conf. Commun., Geneva, Switzerland, May 1993, pp. 1064-1070.

D.J.C. MacKay, "Good error-correcting codes based on very sparse matrices," IEEE Trans. Inform. Theory, vol. 45, pp. 399-431, Mar. 1999.

M. Luby, M. Mitzenmacher, A. Shokrollahi, and D. Spielman, "Improved low-density parity-check codes using irregular graphs," IEEE Trans. Inform. Theory, vol. 47, pp. 585-598, Feb. 2001.

T. Richardson, A. Shokrollahi, and R. Urbanke, "Design of capacity approaching irregular low density parity check codes," IEEE Trans. on Inform. Theory, vol. 47, pp. 618-637, Feb. 2001.

J. Pearl, Probabilistic Reasoning in Intelligent Systems: Networks of Plausible Inference. San Francisco, CA: Morgan Kaufmann, 1998.

(Continued)

*Primary Examiner*—Shelly Chase
(74) *Attorney, Agent, or Firm*—Vierra Magen Marcus & DeNiro LLP

(57) ABSTRACT

The present invention includes a technique for updating messages that originate at the constraint nodes of bi-partite graphs in Low Density Parity Check codes. The technique computes only two outgoing magnitudes at each constraint node and exhibits no measurable performance loss as compared to exact belief propagation which computes a unique magnitude for each departing edge from a given constraint node. The technique eliminates the need for memory based table look-up in the constraint node processing and has been implemented, in one embodiment, using only shift, add, and comparison operations.

27 Claims, 29 Drawing Sheets

OTHER PUBLICATIONS

T. Tian, C. Jones, J. Villasenor, and R.D. Wesel, "Characterization and selective avoidance of cycles in irregular LDPC code construction," International Conference on Communications (ICC) 2003.

C. Jones, A. Matache, T.Tian, J. Villasenor and R. Wesel, "LDPC Codes—University Good for Wireless Channels," Proceedings of the Military Communications Conference, Oct. 2003.

C. Jones, T. Tian, A. Matache, R. Wesel and J. Villasenor, "Robustness of LDPC Codes on Periodic Fading Channels," Proceedings of GlobeCom, Nov. 2002.

T. Richardson and R. Urbanke, "Efficient Encoding of Low Density Parity Check Codes," IEEE Trans. on Inform. Theory, vol. 47, pp. 638-656, Feb. 2001.

J. Chen, A. Dholakia, E. Elefheriou, M. Fossoner, and X.Y. Hu, "Near Optimum Reduced-Complexity Decoding Algorithms for LDPC codes," Proc. IEEE Int. Sym. Inform. Theory, Lausanne, Switzerland, Jul. 2002.

E. Eleftheriou, T. Mittleholzer and A. Dholakia, A Reduced-Complexity Decoding Algorithm for Low Density Parity Check Codes, IEEE Electron. Letters, vol. 37, pp. 102-104,Jan. 2001.

J. Chen and M Fossorier, "Density Evolution for BP-based decoding Algorithm of LDPC codes and their Quanitized Versions," Proc. IEEE Globecom, Taipei, Taiwan, Nov. 2002.

L. Dong-U, J. Villasenor, and W. Luk, "A Hardware Gaussian Noise Generator For Exploring Channel Code Behavior At Very Low Bit Error Rates," In Proceedings of FCCM, May 2003.

Chen and Fossorier, Near Optimum Universal Belief Propagation Based Decoding of LDPC Codes and Extension to Turbo Decoding, IEEE Trans. on Comm., vol. 50, No. 3, Mar. 2001.

* cited by examiner

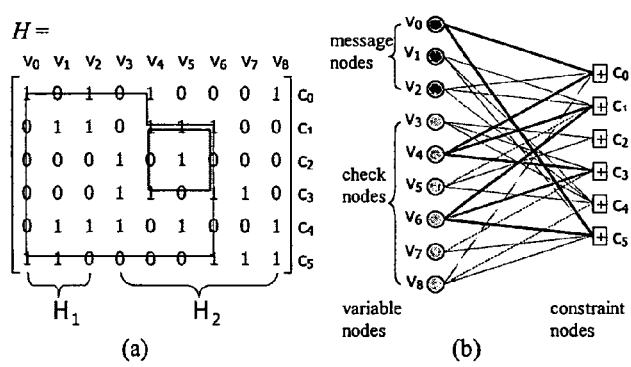
Fig. 1. Matrix and graph descriptions of a (9, 3) code. A length 4 and a length 6 cycle are circumscribed with bold lines.

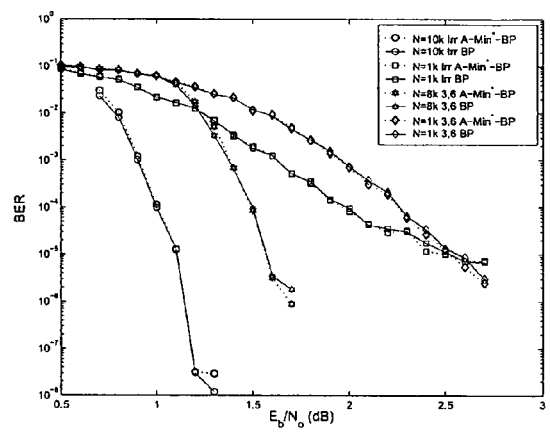

Fig. 2. A-Min*-BP decoding compared to Full-BP decoding for four different rate 1/2 LDPC codes. Length 10k irregular max left degree 20, length 1k irregular max left degree 9, length 8k regular (3,6), length 1k regular (3,6). The proposed algorithm incurs negligible performance loss. Note that rate 1/2 BPSK constrained capacity is 0.18 dB ($E_b/N_o$). All simulations were performed with the same initial random seed.

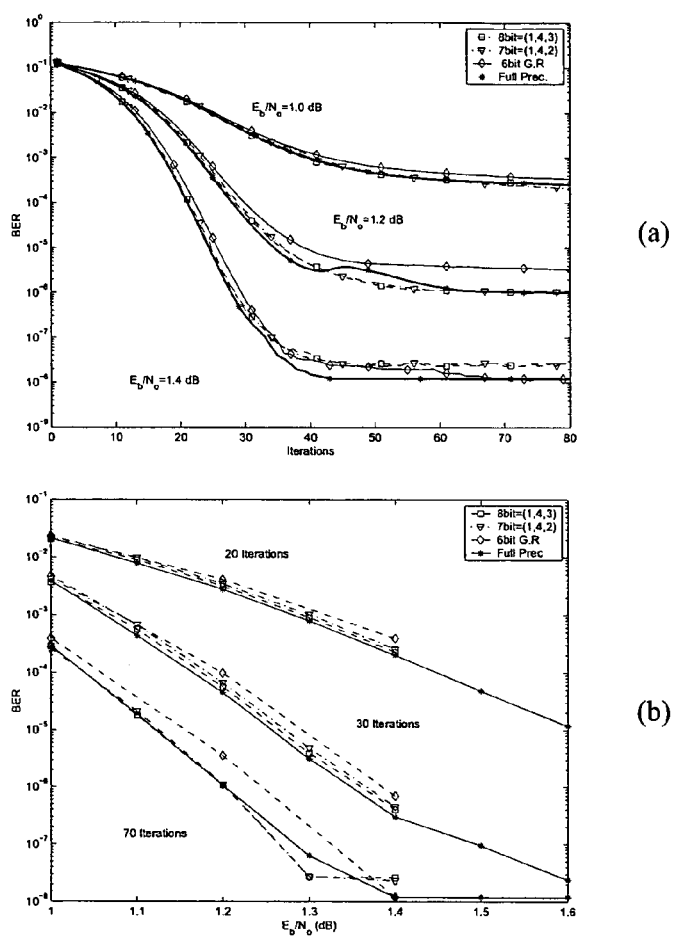
Fig. 3. (a) BER Vs. $E_b/N_o$, for different fixed numbers of iterations. (b) BER vs Iterations, for different fixed $E_b/N_o$.

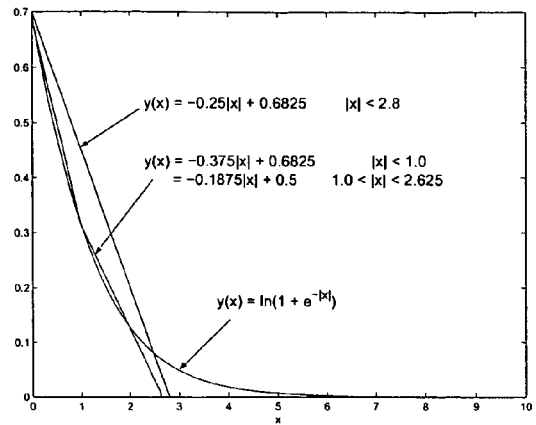

Fig. 4. Non-linear function ($\Lambda^{BP^*}$) at the core of proposed algorithm and single / double line approximations to the function that can easily be implemented in combinatorial logic.

|  | Full-BP | A-Min*-BP | Offset-Min-BP |
|---|---|---|---|
| Table LookUps | $2d_c$ | $d_c - 1$ | 0 |
| Comparisons | 0 | $d_c - 1$ | $2d_c - 3$ |
| Additions | $2d_c - 1$ | 0 | $d_c$ |
| XORs | $2d_c - 1$ | $2d_c - 1$ | $2d_c - 1$ |
| Tot Table Lookups | 80000 | 35000 | 0 |
| Tot Comparisons | 0 | 35000 | 65000 |
| Tot Additions | 75000 | 0 | 40000 |
| Tot XORs | 75000 | 75000 | 75000 |
| Tot Ops | 230,000 | 145,000 | 180,000 |
| Performance | Reference | No Loss | 0.1dB Loss |

Fig. 5. Complexity comparison for three constraint update techniques. Full-BP and A-Min*-BP have essentially the same performance. The simplest technique, Offset-Min-BP, experiences about a 0.1dB loss [12]. Numerical values are shown for a rate 1/2 code with: $n - k = 5000$, and average right degree $d_c=8$.

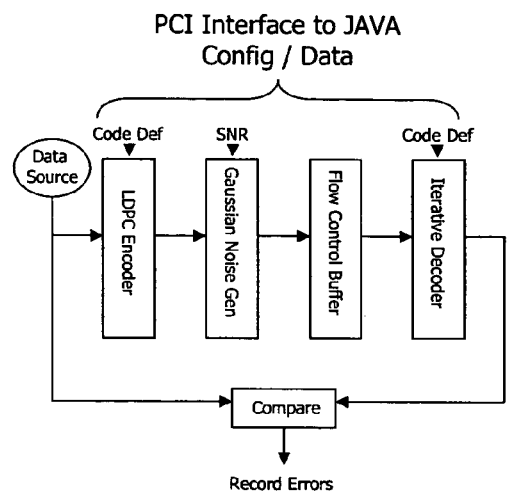
Fig. 6. Architecture block diagram.
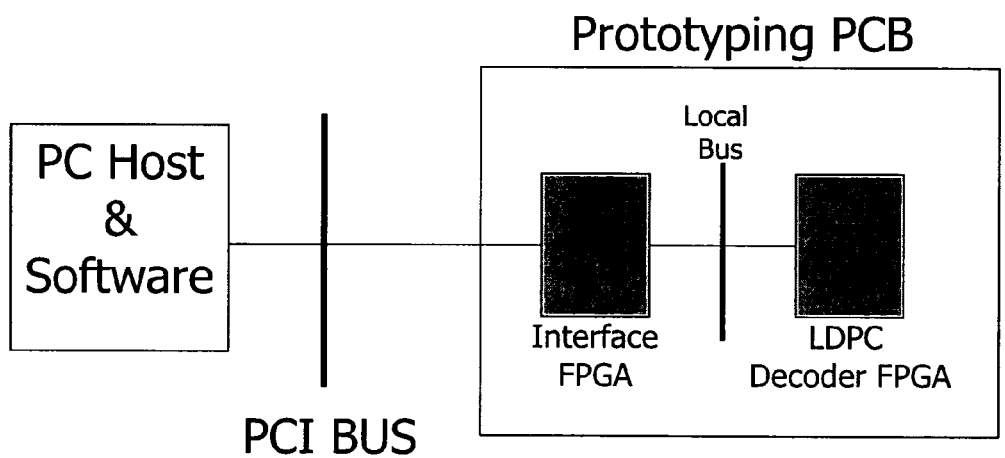
Fig. 7. Block diagram of PC / FPGA board prototyping environment.

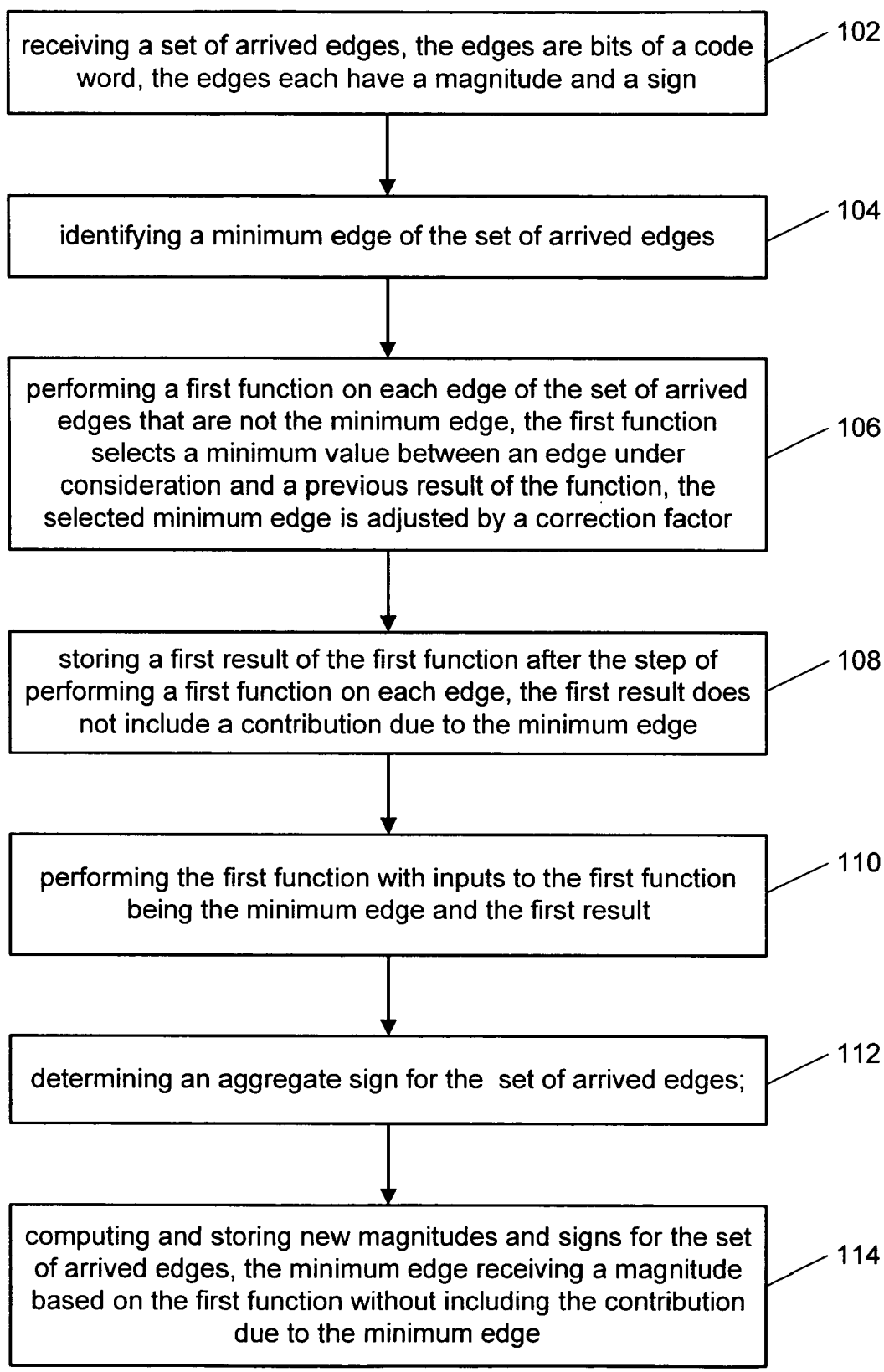

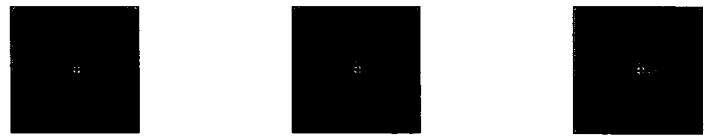
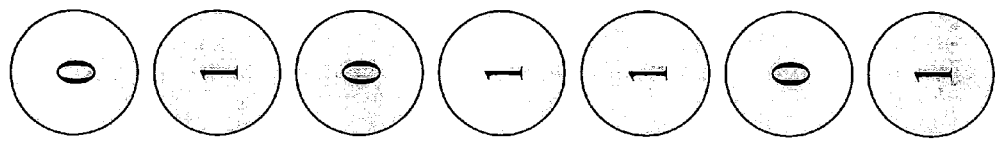
Message Passing Decoder Corrected All three Erasures.
Success!
Fig. 31

DECODING LOW DENSITY PARITY CODES

This application claims the benefit of U.S. Provisional Application No. 60/510,183, "Decoding Low Density Parity Codes" filed on Oct. 10, 2003, which is incorporated herein by reference in its entirety.

This invention was made with Government support of Grant No. N00014-01-C-0016, awarded by the Office of Naval Research. The Government has certain rights in this invention.

BACKGROUND OF THE INVENTION

1. Field of the Invention

The present invention is directed to technology relevant to decoding Low Density Parity codes.

2. Description of the Related Art

Communication technology has become more important and has received greater attention as more people communicate via computer networks, telephone networks and various wireless networks. The goal is to communicate data in a reliable and efficient manner. However, data being communicated can be corrupted. For example, wireless data (e.g. digital or analog, voice or non-voice) is subject to noise.

There are two broad classes of solutions for insuring that data is communicated accurately. First, there is ARQ, which includes re-transmitting data if there is a problem. Second, there is Forward Error Correction (FEC), which includes using codes with the data to detect and, possibly, correct, corrupt data.

The problem being solved with FEC is how much redundancy to add in an intelligent manner to make sure that the data arrives correctly. Long codes do a better job insuring correctness, but are more complex and harder to work with. Thus, most codes used are shorter codes operating on smaller block lengths.

There are at least two classes of larger codes being used for FEC: Turbo codes and Low Density Parity Codes (LDPC). Low Density Parity Codes were proposed by Gallager in the early 1960s. R. G. Gallager, "Low-density parity-check codes," IRE Trans. Inform. Theory, vol. IT-8, pp. 21-28, January 1962. The structure of Gallager's codes (uniform column and row weight) led them to be called regular LDPC codes. Gallager provided simulation results for codes with block lengths on the order of hundreds of bits. However, these codes were too short for the sphere packing bound to approach Shannon capacity, and the computational resources for longer random codes were decades away from being broadly accessible.

Following the groundbreaking demonstration by Berrou et al. (C. Berrou, A. Glavieux, and P. Thitimajshima, "Near Shannon limit error-correcting coding and decoding: Turbo codes," in Proc. IEEE Int. Conf. Commun., Geneva, Switzerland, May 1993, pp. 1064-1070) of the impressive capacity-approaching capability of long random linear (turbo) codes, MacKay (D. J. C. MacKay, "Good error-correcting codes based on very sparse matrices," IEEE Trans. Inform. Theory, vol. 45, pp. 399-431, March 1999) re-established interest in LDPC codes during the mid to late 1990s. Luby et al (M. Luby, M. Mitzenmacher, A. Shokrollahi, and D. Spielman, "Improved low-density parity-check codes using irregular graphs," IEEE Trans. Inform. Theory, vol. 47, pp. 585-598, February 2001) formally showed that properly constructed irregular LDPC codes can approach capacity more closely than regular codes. Richardson, Shokrollahi and Urbanke (T. Richardson, A. Shokrollahi, and R. Urbanke, "Design of capacity approaching irregular low density parity check codes," IEEE Trans. on Inform. Theory, vol. 47, pp. 618-637, February 2001) created a systematic method called density evolution to analyze and synthesize the degree distribution in asymptotically large random bipartite graphs under a wide range of channel realizations.

In his original work, Gallager also introduced several decoding algorithms. One of these algorithms has since been identified for general use in factor graphs and Bayesian networks (J. Pearl, Probabilistic Reasoning in Intelligent Systems: Networks of Plausible Inference. San Francisco, Calif.: Morgan Kaufmann, 1998) and is often generically described as Belief Propagation (BP). In the context of LDPC decoding, messages handled by a belief propagation decoder represent probabilities that a given symbol in a received codeword is either a one or a zero. These probabilities can be represented absolutely, or more compactly in terms of likelihood ratios or likelihood differences. The logarithmic operator can also be applied to either of these scenarios. Due to the complexity of the associated operator sets and word length requirements, the log-likelihood ratio form of the Sum-Product algorithm is the form that is best suited to VLSI implementation. However, this form still posses significant processing challenges as it employs a non-linear function that must be represented with a large dynamic range for optimal performance. Throughout the rest of the document, unaltered log-likelihood belief propagation with the described as Full BP.

FIGS. 9-14 depict bipartite graphs, which include variable nodes and constraint nodes. FIGS. 15-31 depict the use of bipartite graphs for massage passing decoding.

Even Full-BP algorithms suffer performance degradation as compared to the optimum Maximum Likelihood (ML) decoder for a given code. This is due to the fact that bipartite graphs representing finite-length codes without singly connected nodes are inevitably non-tree-like. Cycles in bipartite graphs compromise the optimality of belief propagation decoders. The existence of cycles implies that the neighbors of a node are not in general conditionally independent (given the node), therefore graph separation does not hold and Pearl's polytree algorithm (J. Pearl, Probabilistic Reasoning in Intelligent Systems: Networks of Plausible Inference. San Francisco, Calif.: Morgan Kaufmann, 1998) (which is analogous to Full-BP decoding) inaccurately produces graph a-posteriori probabilities. Establishing the true ML performance of LDPC codes with length beyond a few hundred bits is generally viewed as an intractable problem. However, code conditioning techniques (T. Tian, C. Jones, J. Villasenor, and R. D. Wesel, "Characterization and selective avoidance of cycles in irregular LDPC code construction," International Conference on Communications (ICC) 2003) can be used to mitigate the non-optimalities of iterative decoders and performance that approaching the Shannon capacity is achievable even with the presence of these decoding non-idealities.

SUMMARY OF THE INVENTION

The present invention, roughly described, relates to technology for decoding LDPC codes. In one embodiment, the system computes only two unique magnitudes per constraint node, rather than the number $d_c$ of messages associated with a constraint node and/or uses combinational logic rather than table look-up to approximate the non-linear portion of the constraint update. A reduced complexity decoding algorithm that suffers little or no performance loss has been developed and is justified both theoretically and experimentally. Finite word lengths have been carefully considered and 6 to 7 bits of precision have been shown to be adequate for a highly complex (a length of 10,000 $d_{max}=20$ irregular LDPC) code to achieve an error floor that is code rather than implementation limited. The technique eliminates the need for memory based table look-up in the constraint node processing and has been implemented, in one embodiment, using only shift, add, and comparison operations.

One embodiment of the present invention includes receiving a set of arrived edges, where the edges are bits of a code word and the edges each have a magnitude as well as a sign. A minimum edge of the set of arrived edges is identified. A first function is performed on each edge of the set of arrived edges that are not the minimum edge. The first function selects a minimum value between an edge under consideration and a previous result of the function. In one embodiment, the minimum edge is adjusted by a correction factor. A first result of the first function is stored, after the step of performing a first function on each edge. The first result does not include a contribution due to the minimum edge. The first function is performed again with the minimum edge and the first result as the inputs to the first function. An aggregate sign is determined for the set of arrived edges. New magnitudes and signs are computed and stored for the set of arrived edges. The minimum edge receives a magnitude based on the first function without including the contribution due to the minimum edge.

The present invention can be accomplished using hardware, software, or a combination of both hardware and software. The software used for the present invention is stored on one or more processor readable storage devices including hard disk drives, CD-ROMs, DVDs, optical disks, floppy disks, tape drives, flash memory, RAM, ROM or other suitable storage devices. In alternative embodiments, some or all of the software can be replaced by dedicated hardware including custom integrated circuits, gate arrays, FPGAs, PLDs, and special purpose computers. In one embodiment, software implementing the present invention is used to program one or more processors. The processors can be in communication with one or more storage devices, and/or communication interfaces (e.g. modem, network card, keyboard, monitor, etc.).

These and other objects and advantages of the present invention will appear more clearly from the following description in which the preferred embodiment of the invention has been set forth in conjunction with the drawings.

BRIEF DESCRIPTION OF THE DRAWINGS

FIGS. 1(a) and (b) depict matrix and graph descriptions of a (9,3) code.

FIG. 2 is a graph comparing A-Min*-BP decoding to Full-BP decoding.

FIG. 3(a) is a graph comparing BER v. $E_b/N_o$ for different fixed number of iterations.

FIG. 3(b) is a graph comparing BER v. iterations, for different fixed $E_b/N_o$.

FIG. 4 is a graph of a non-linear function.

FIG. 5 is a table comparing complexity of three constraint update techniques.

FIG. 6 is an architectural block diagram.

FIG. 7 is a block diagram of a personal computer with a board having an FPGA for implementing an embodiment of the present invention.

FIG. 8 is a flow chart describing one embodiment of a method for decoding according to the present invention.

FIGS. 9-31 depict various aspects relevant to the present invention.

DETAILED DESCRIPTION

I. LOW-DENSITY PARITY-CHECK CODES

Figure 9:
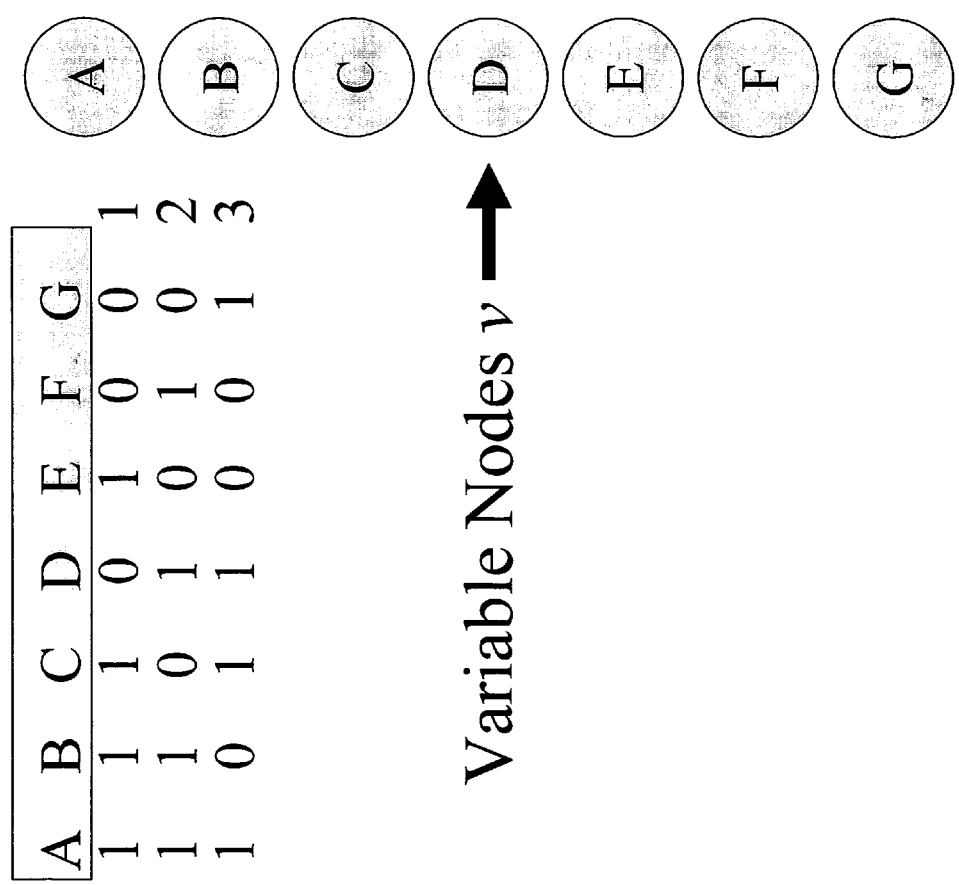
Figure 10:
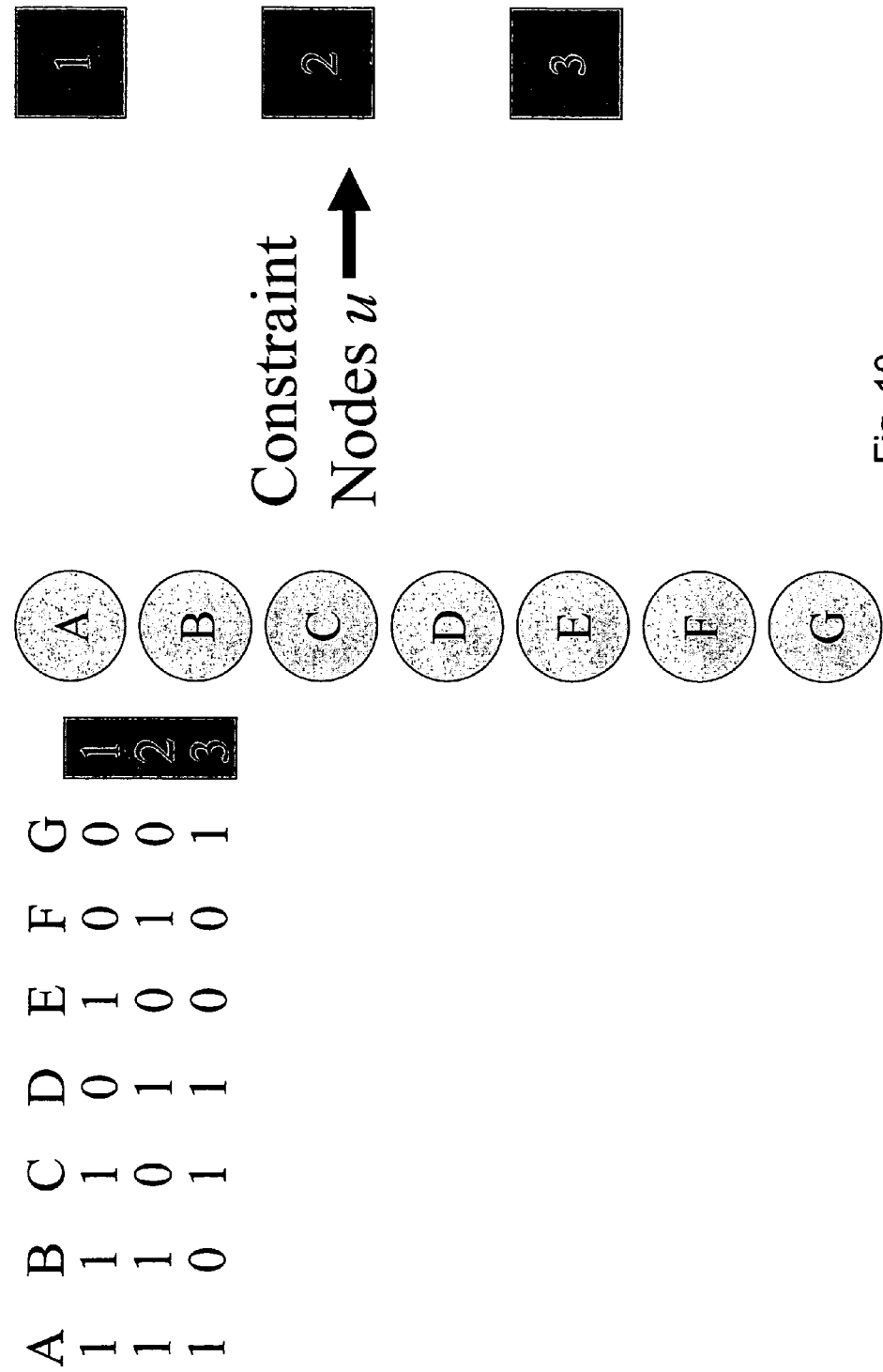
Figure 11:
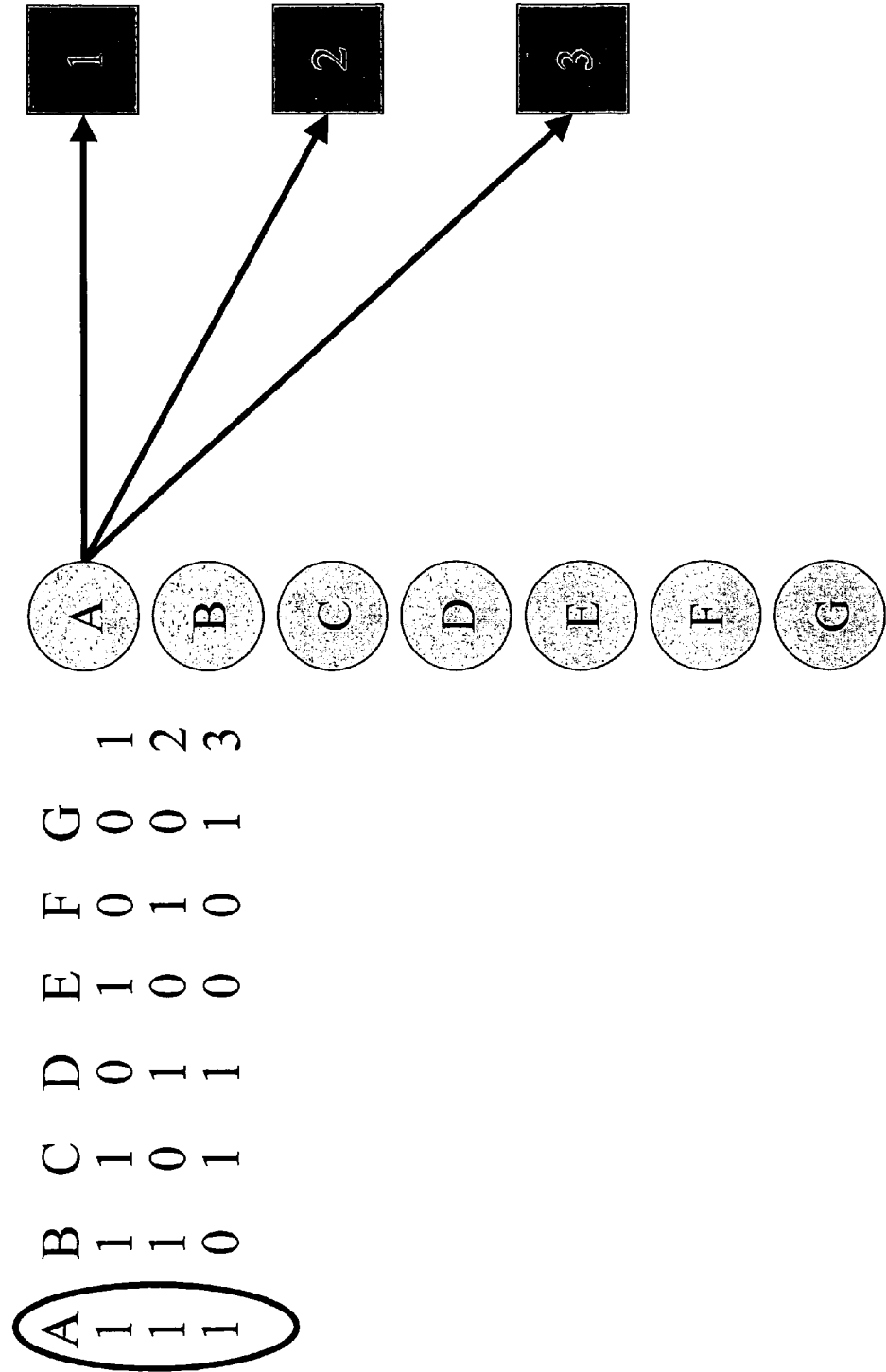
Figure 12:
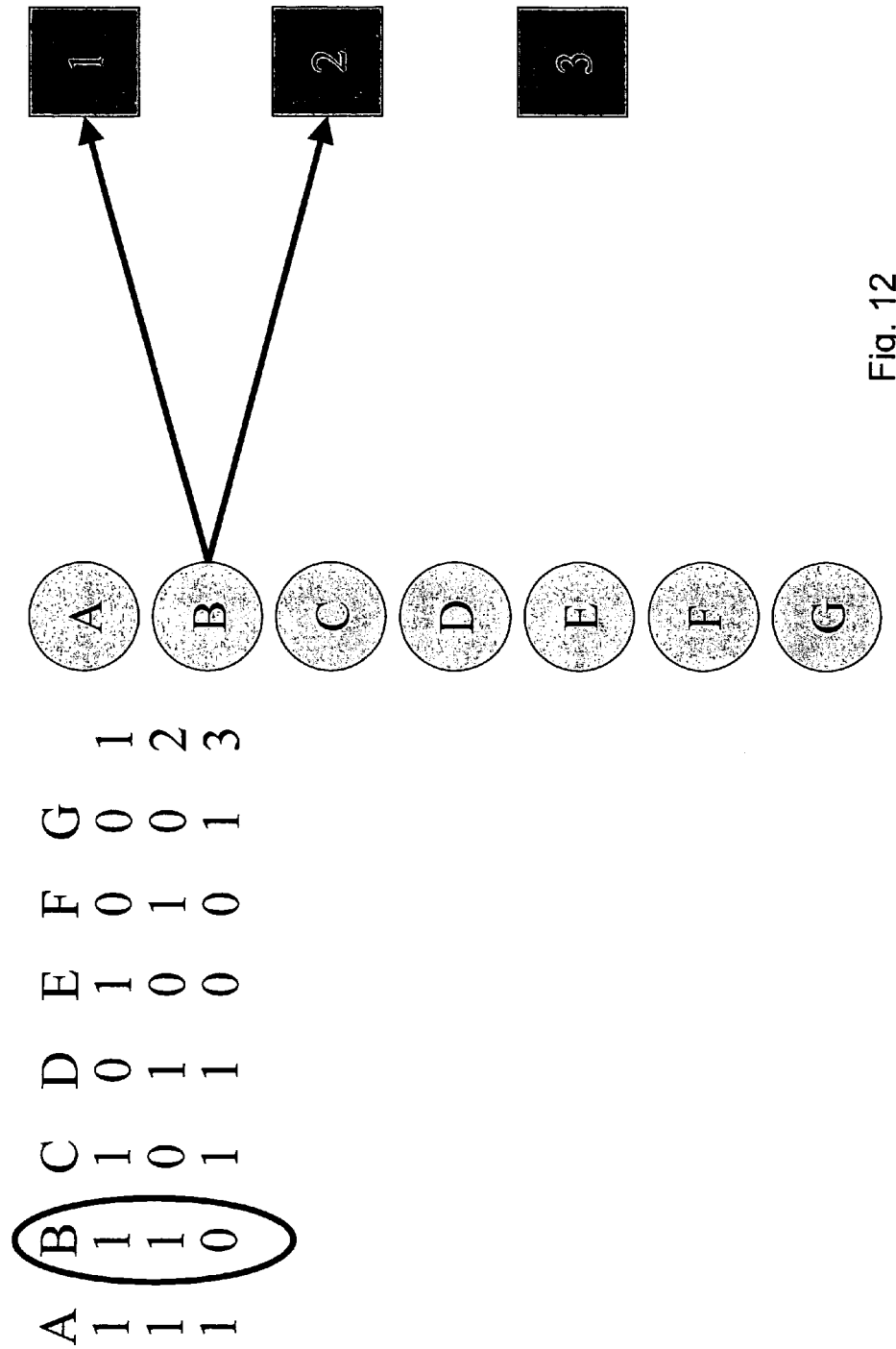
Figure 13:
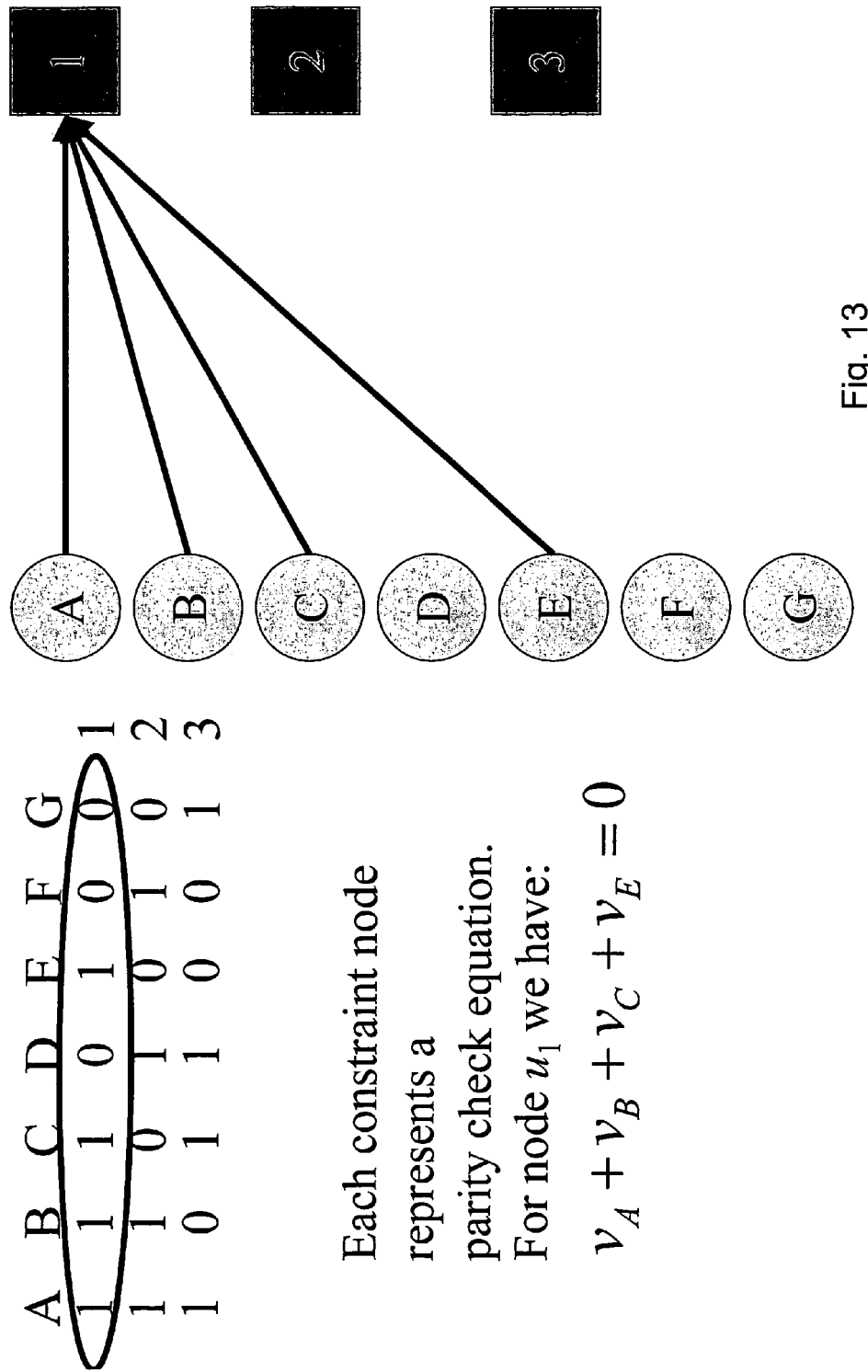
Figure 14:
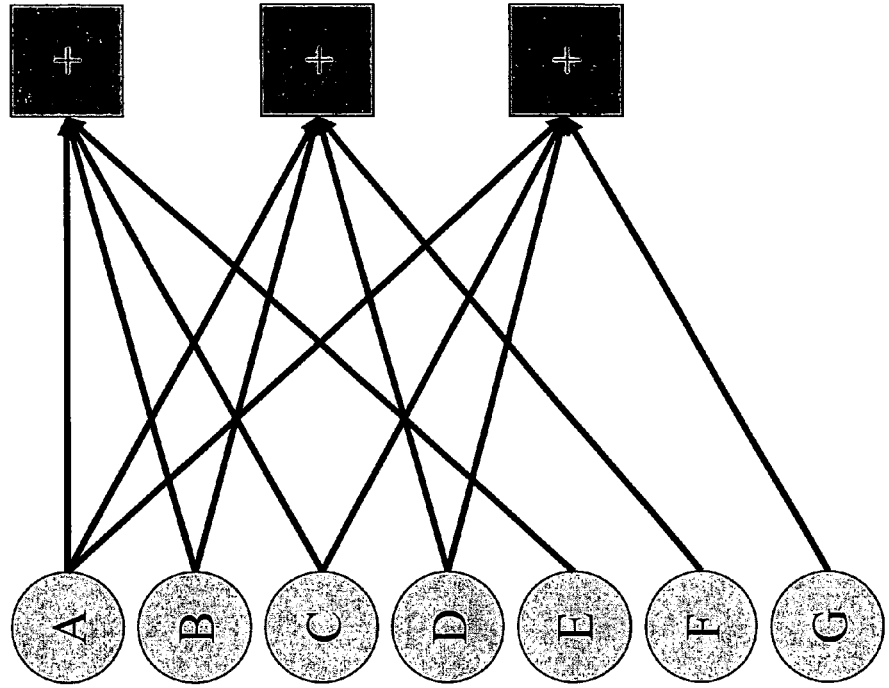
Figure 15:
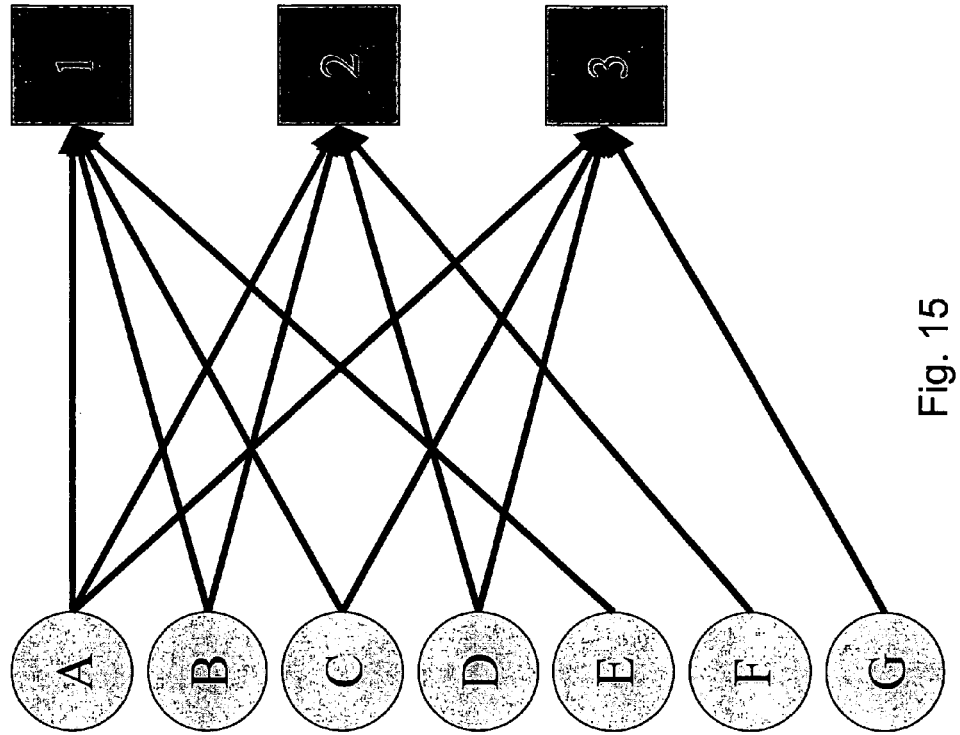
Figure 16:
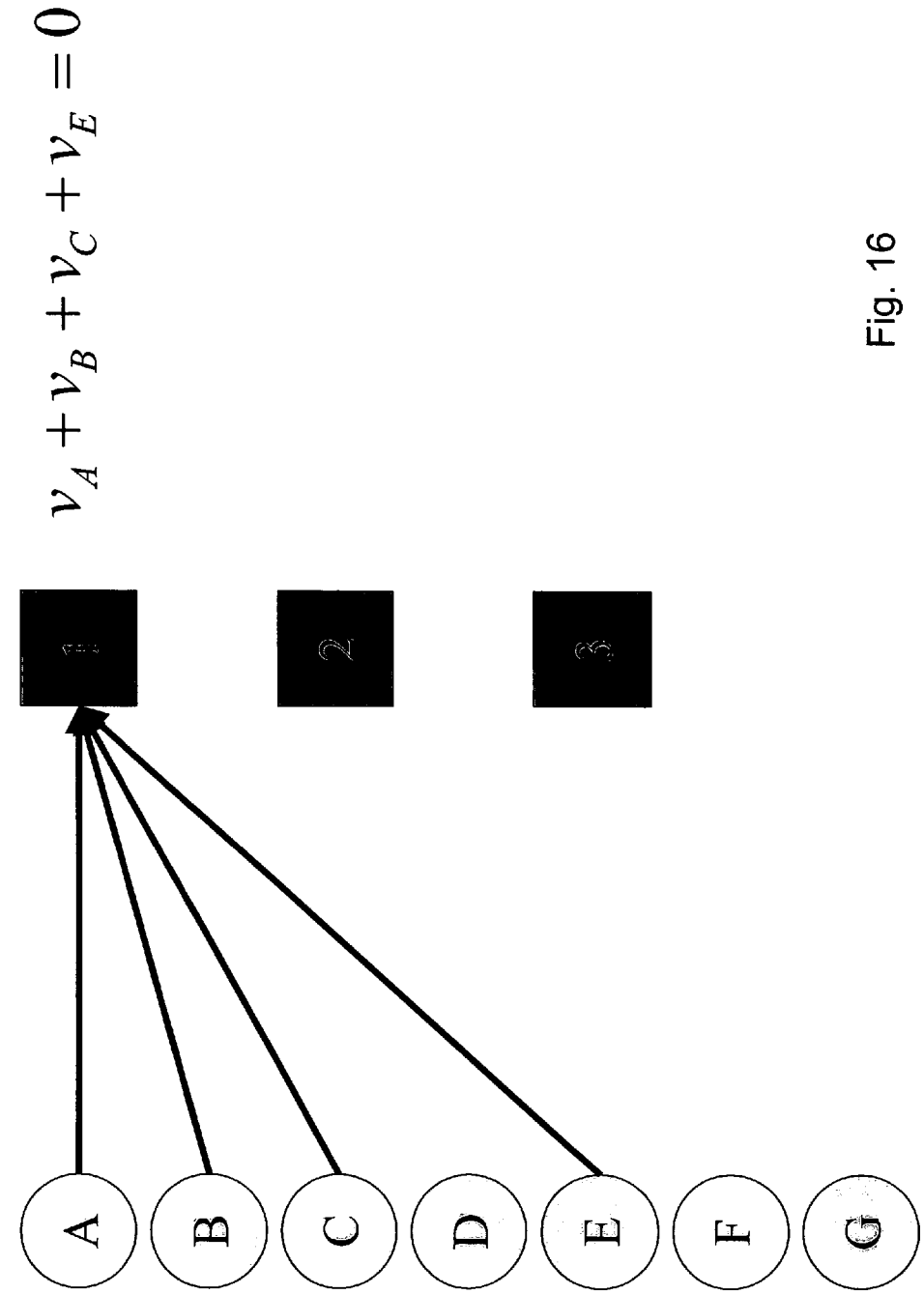
Figure 17:
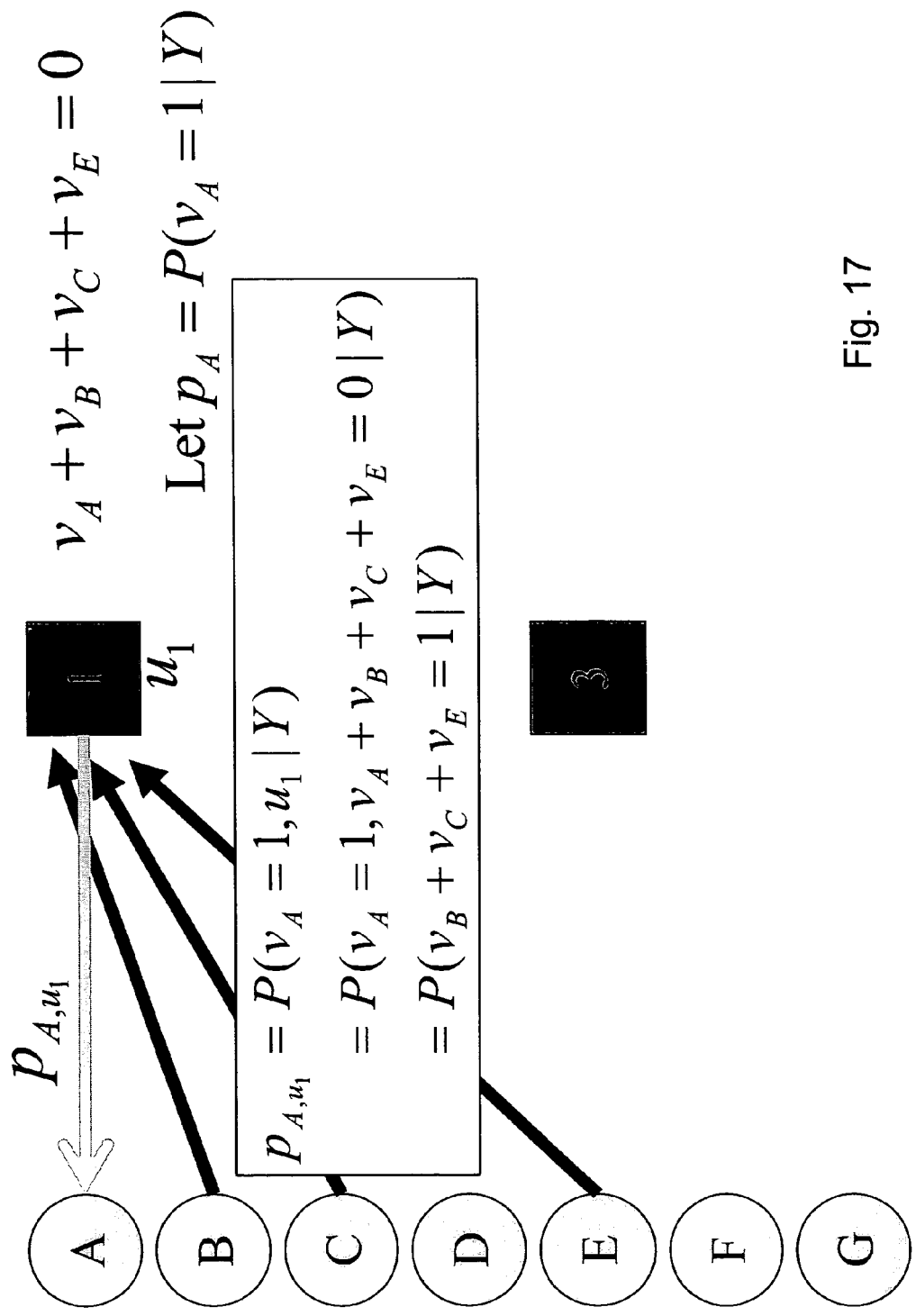
Figure 18:
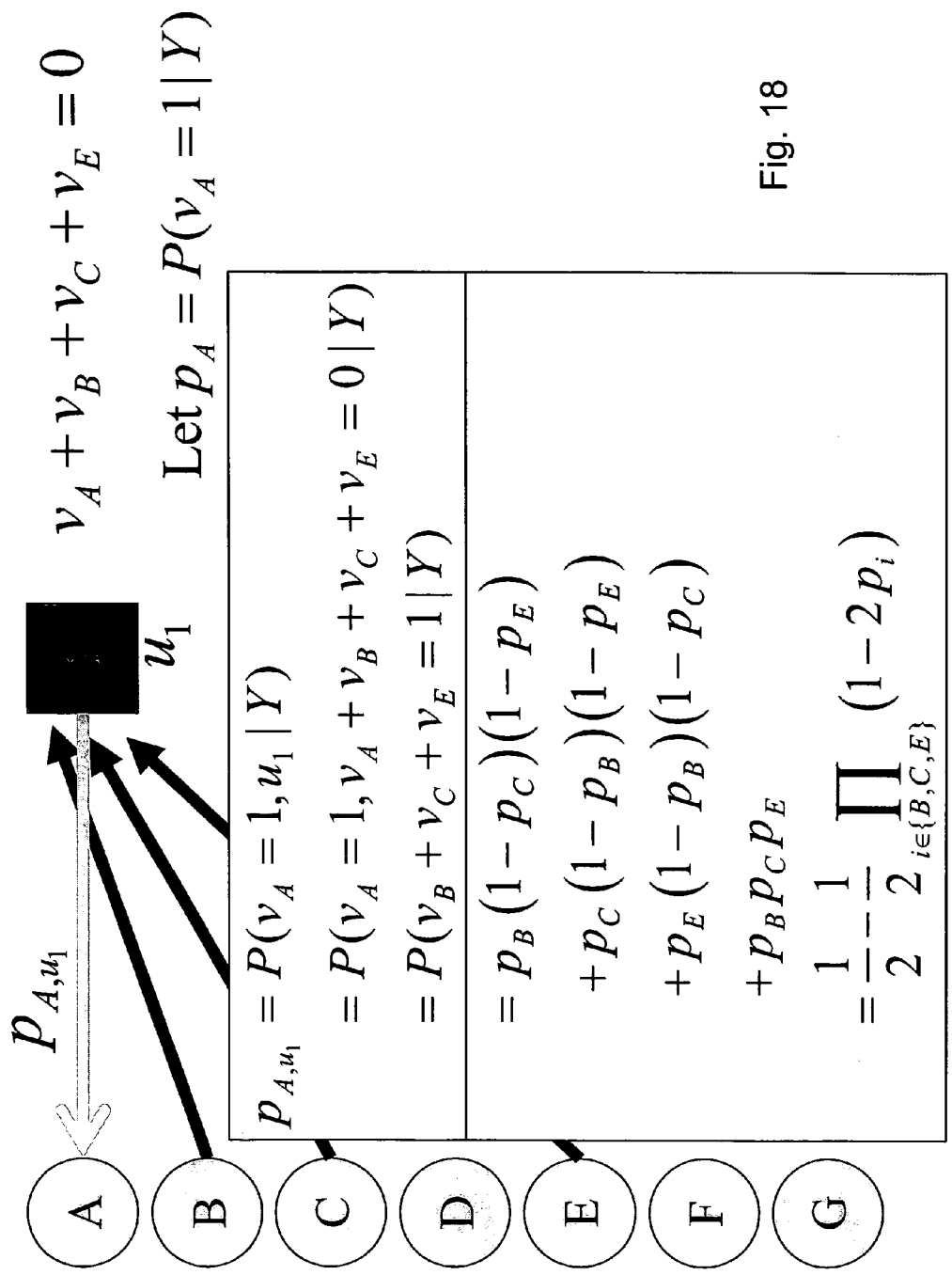
Figure 19:
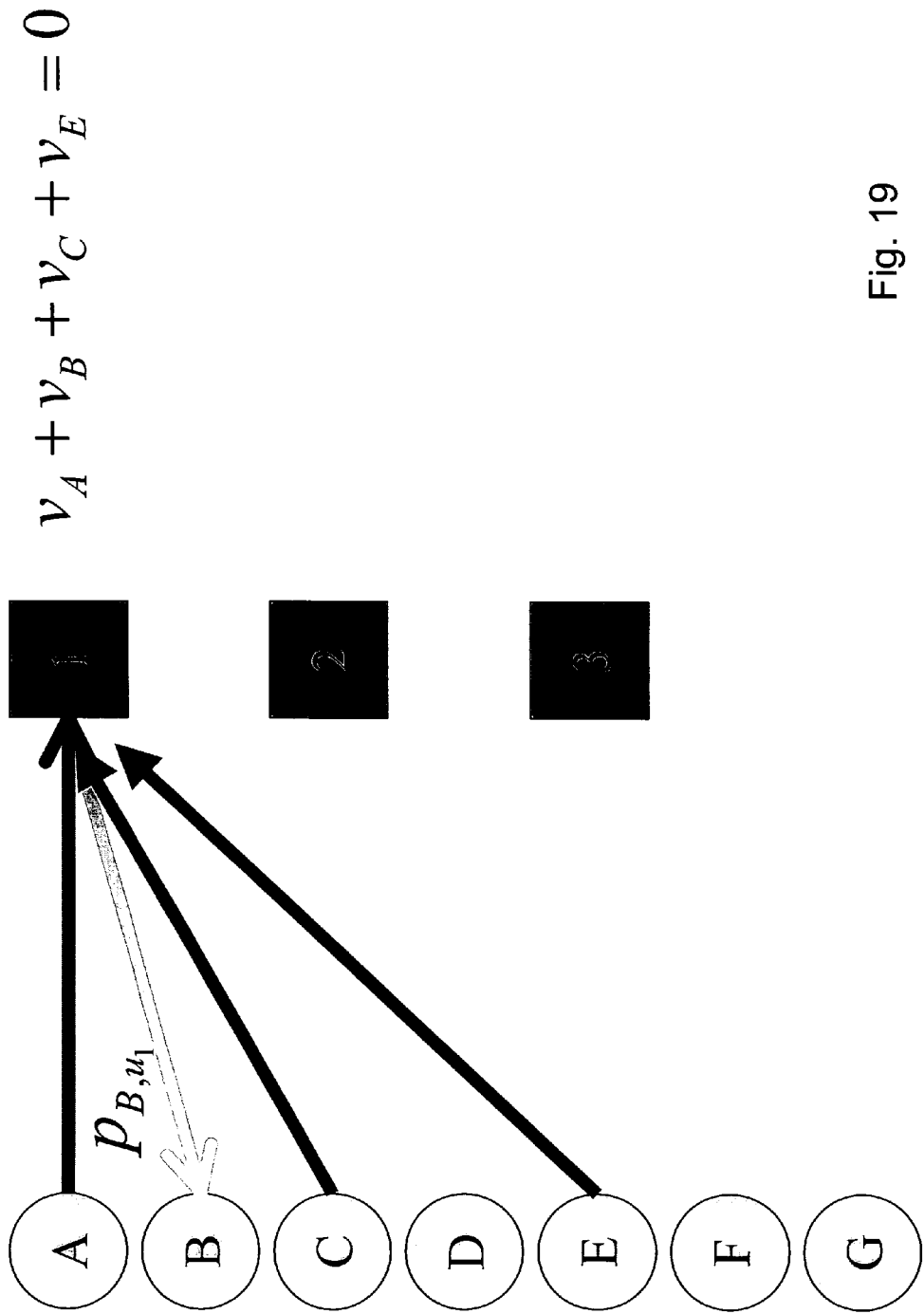
Figure 20:
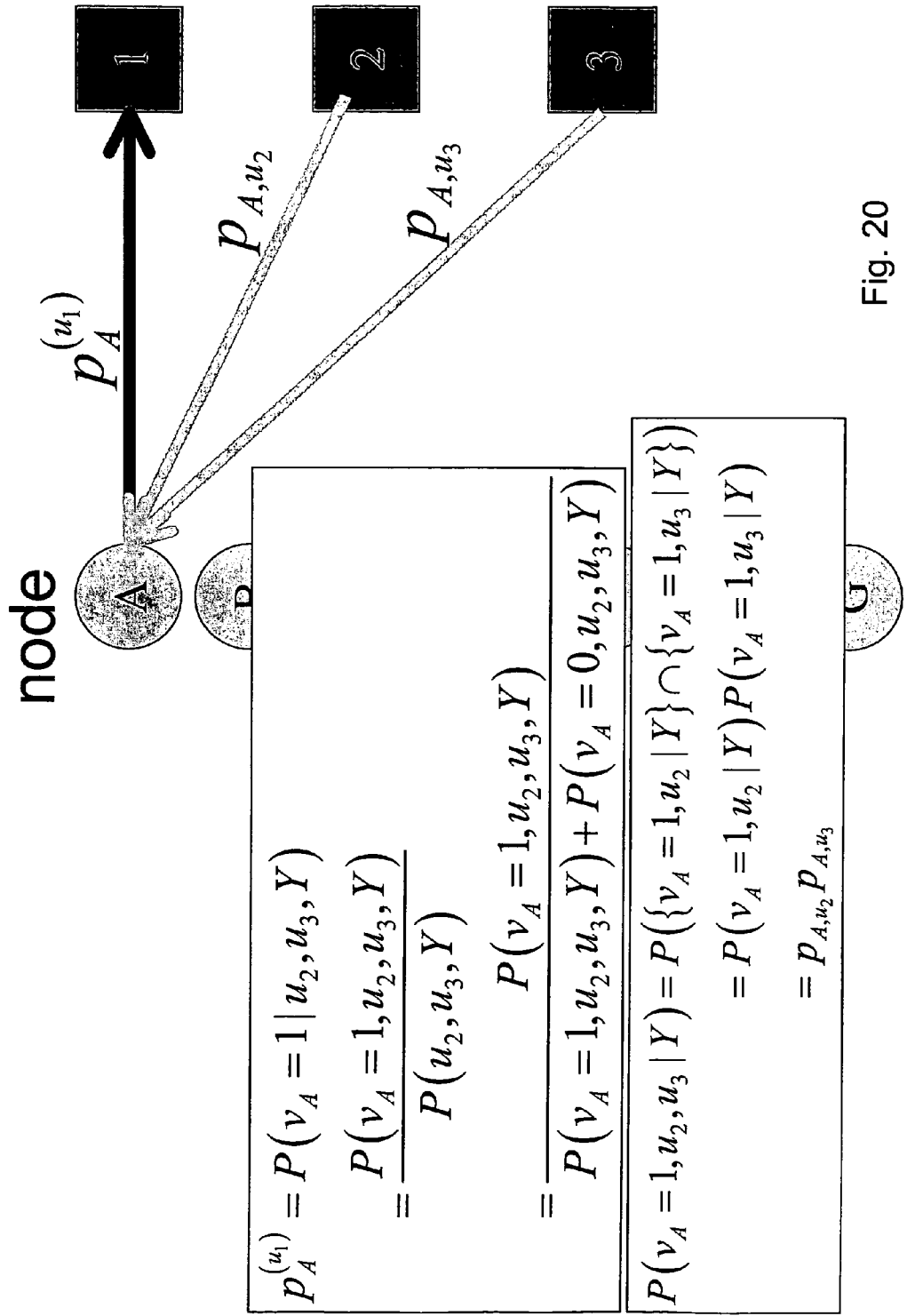
Figure 21:
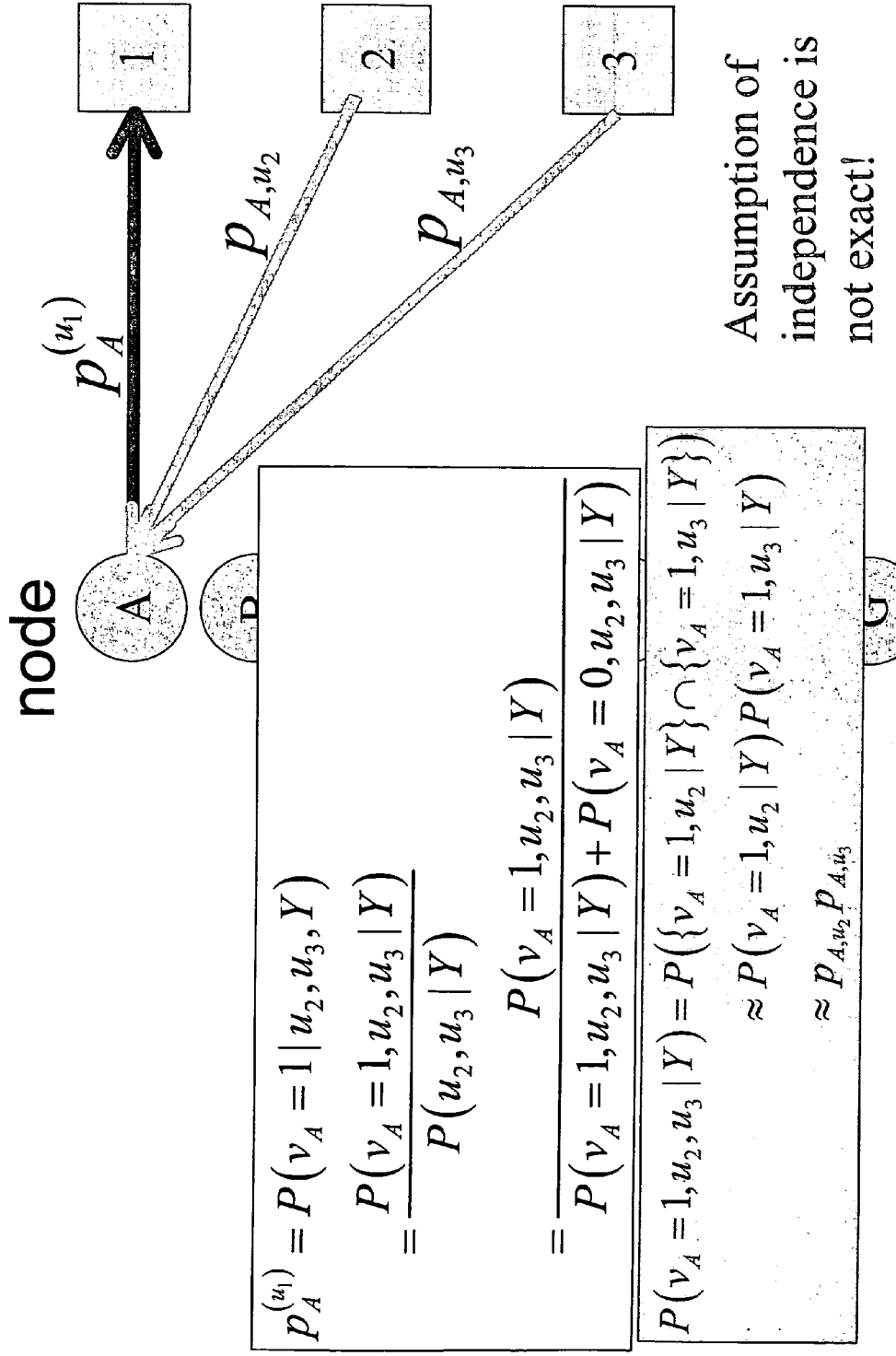
Figure 22:
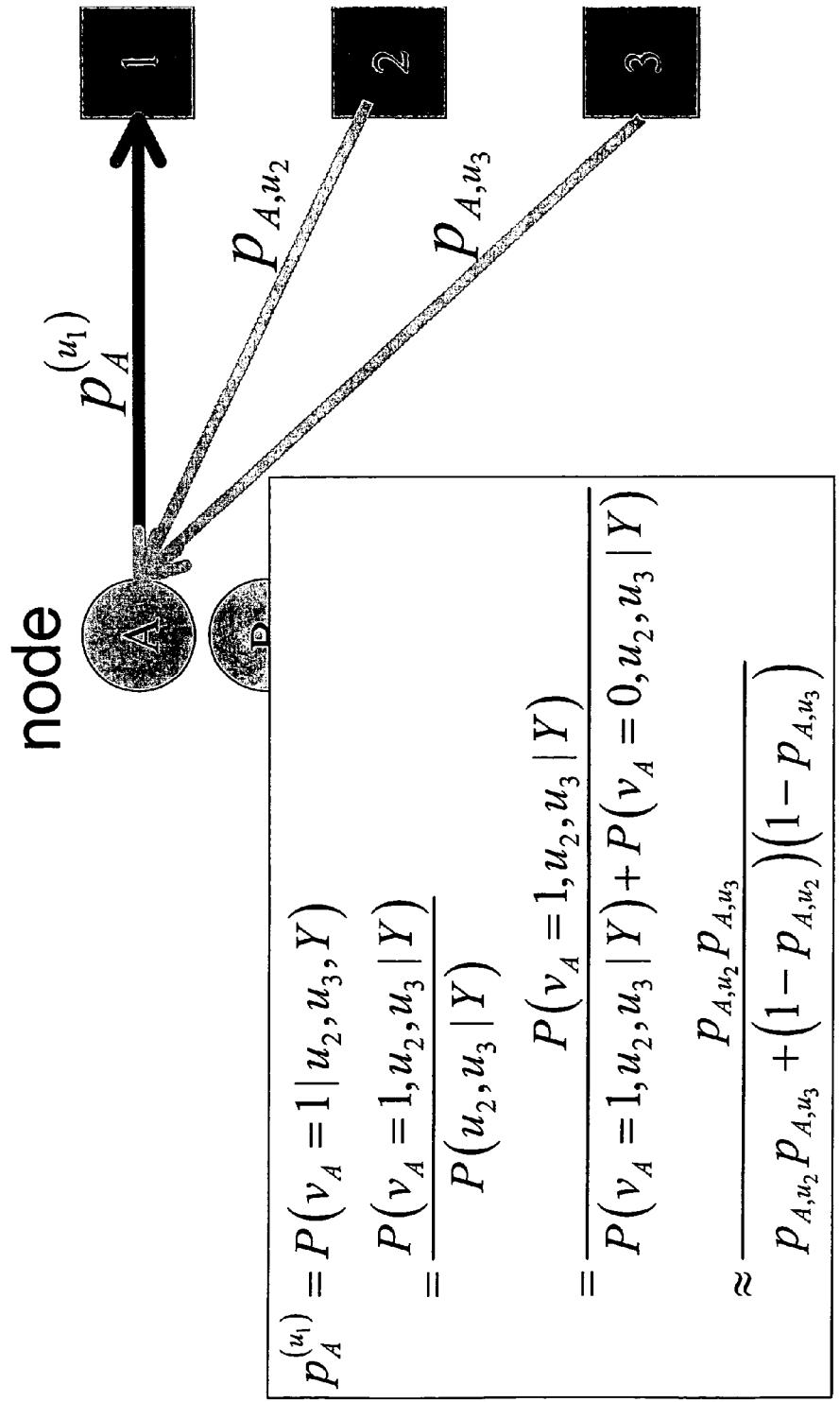
Figure 23:
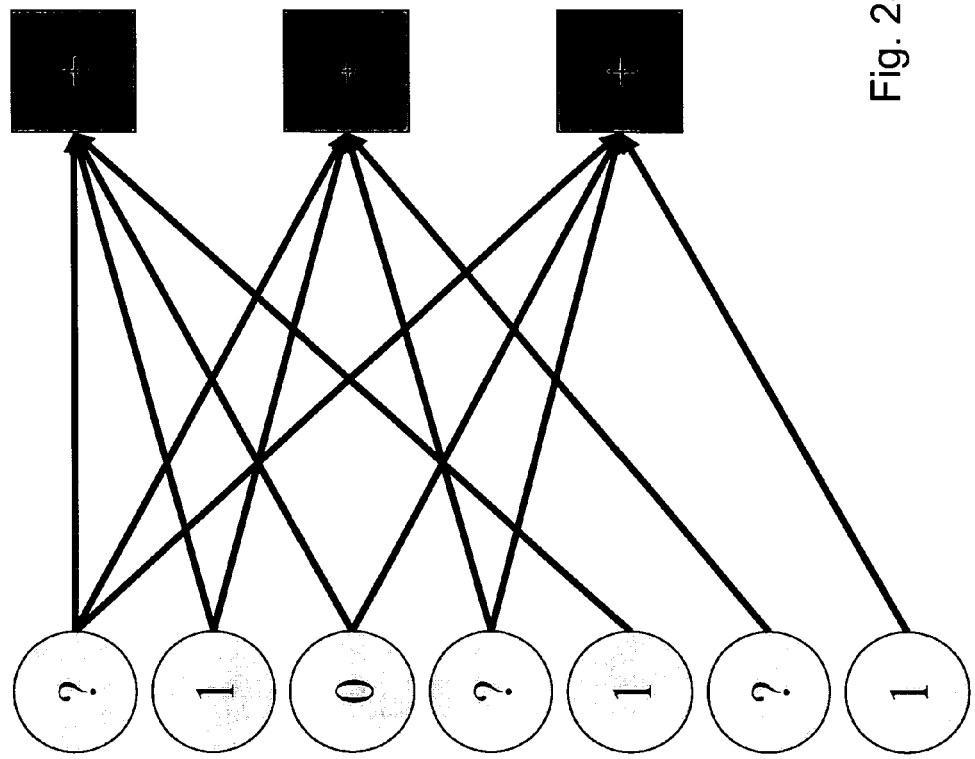
Figure 24:
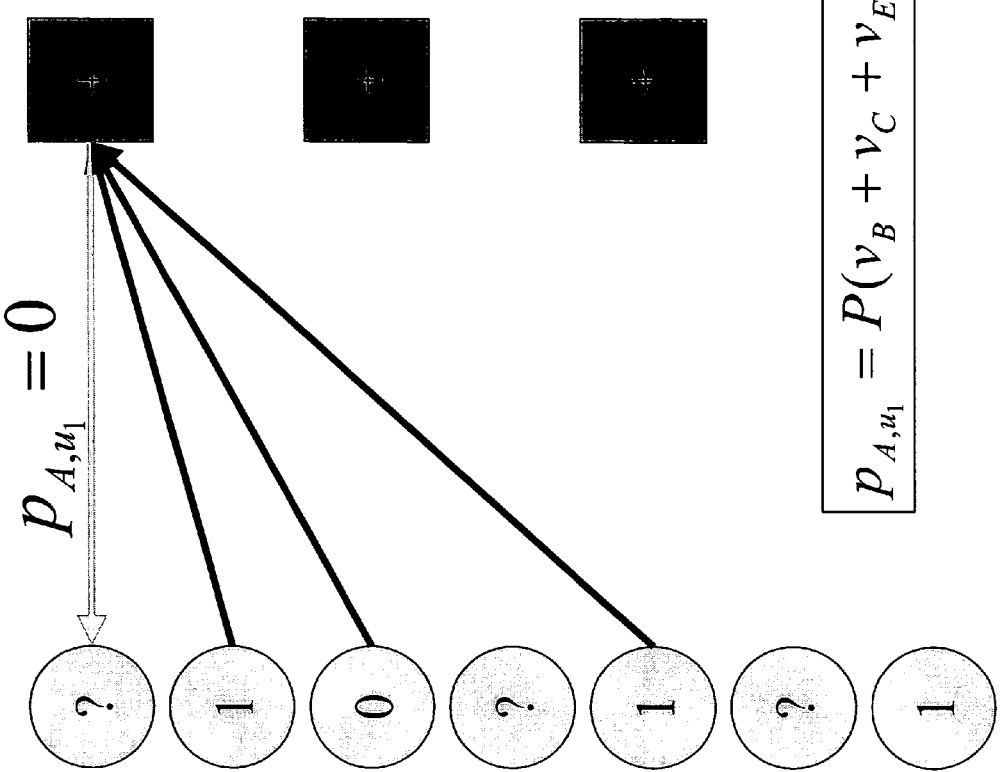
Figure 25:
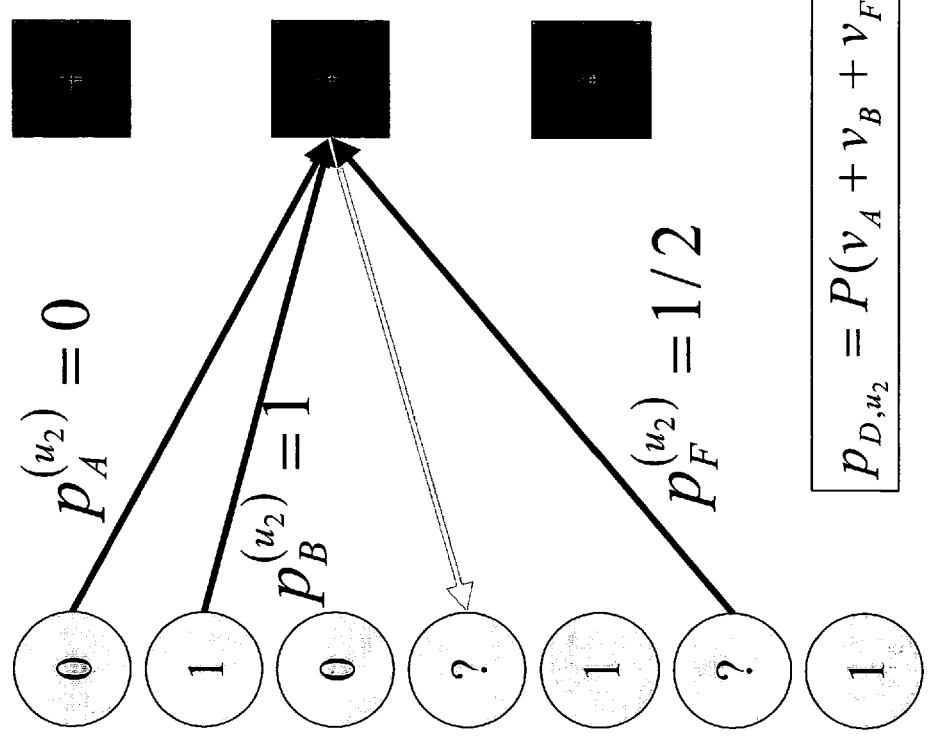
Figure 26:
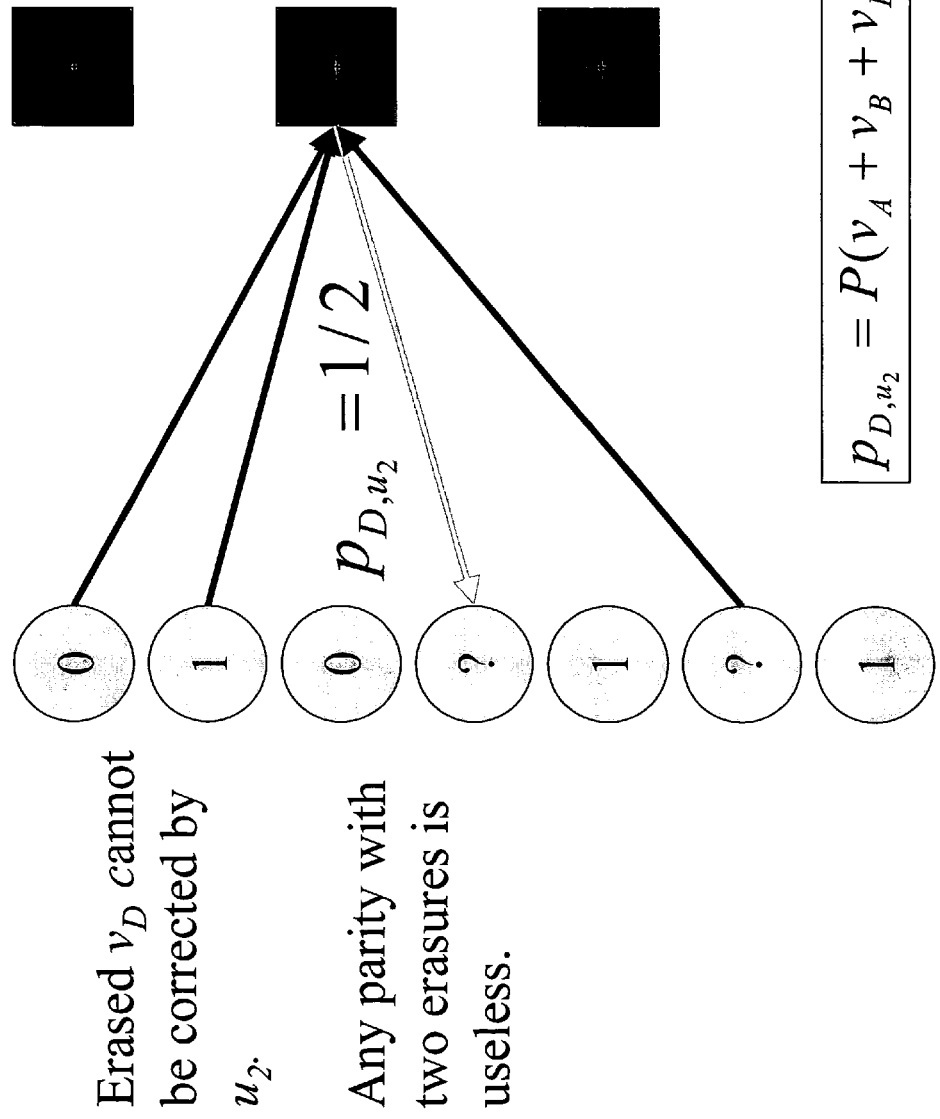
Figure 27:
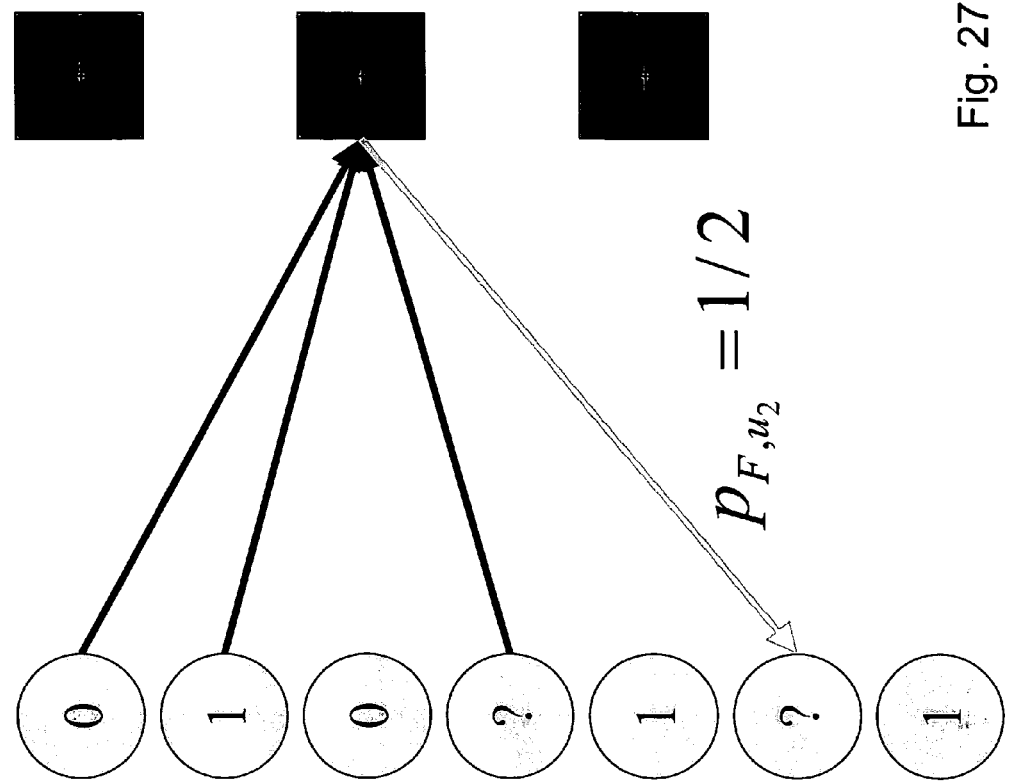
Figure 28:
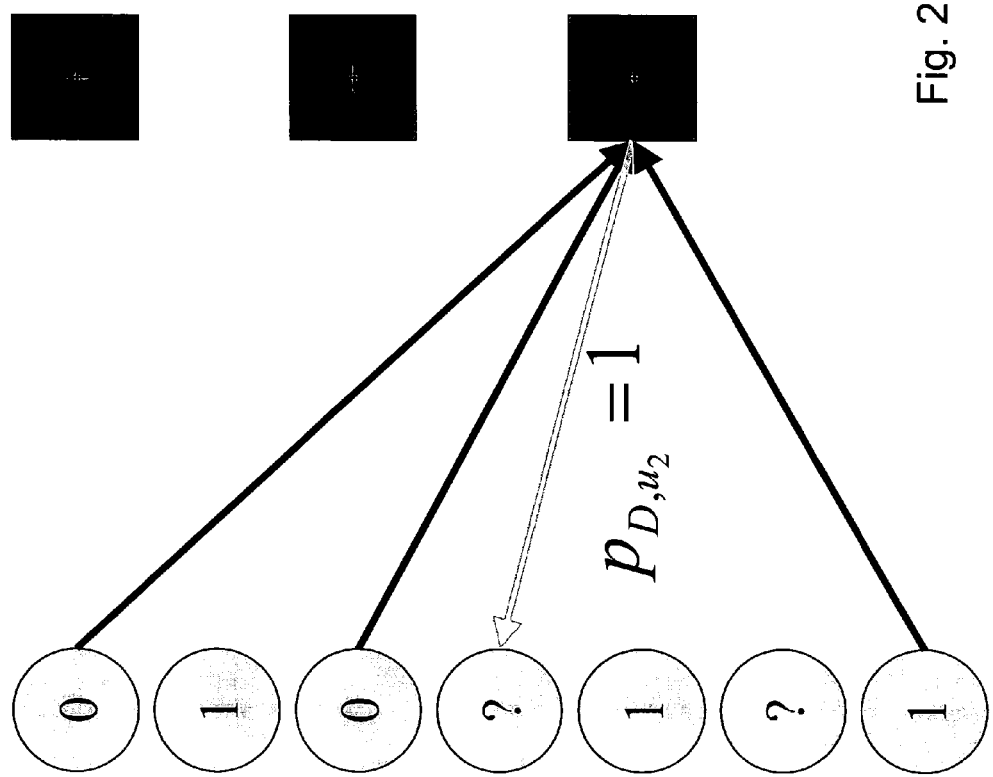
Figure 29:
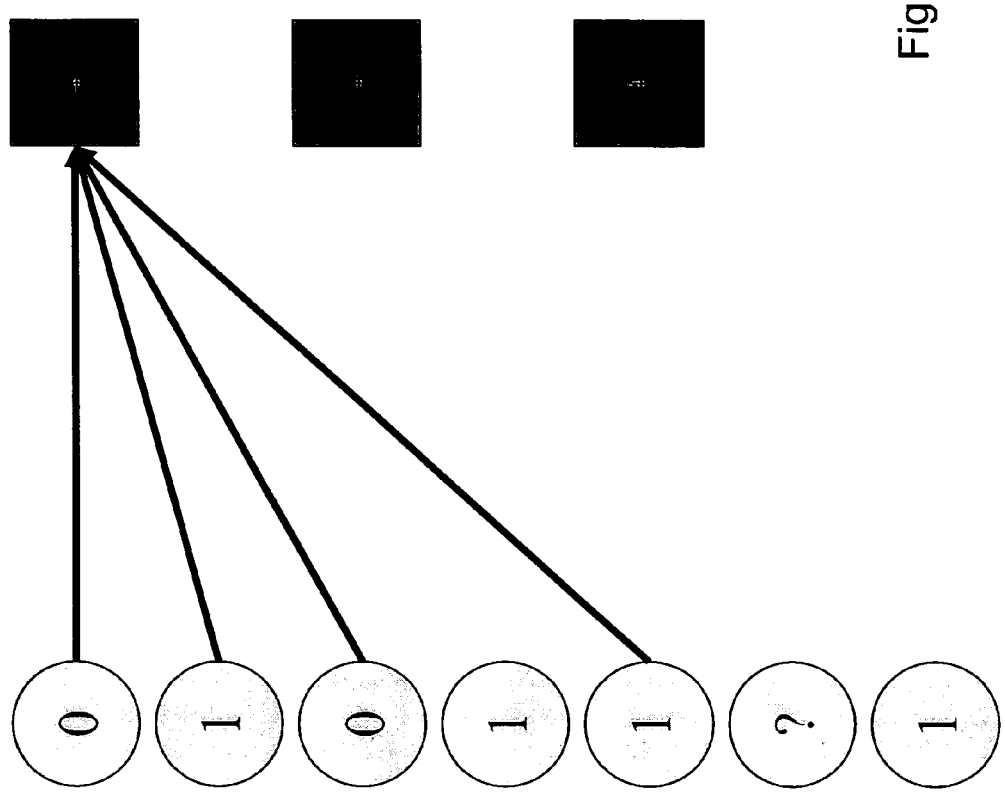
Figure 30:
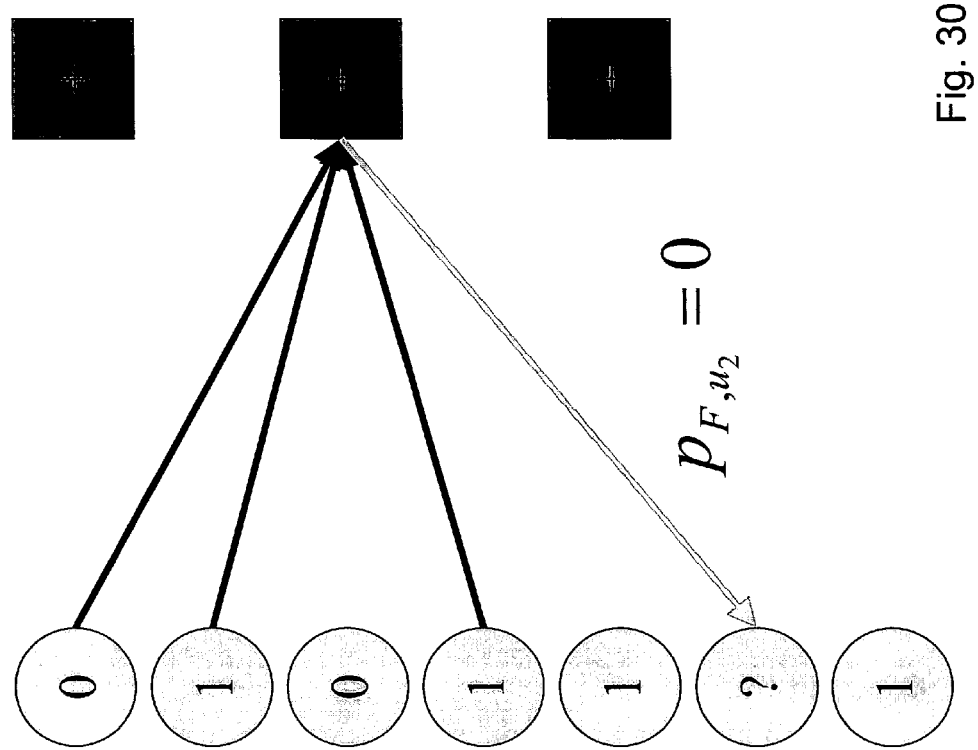

Like turbo codes, LDPC codes belong to the class of codes that are decodable primarily via iterative techniques. The demonstration of capacity approaching performance in turbo codes stimulated interest in the improvement of Gallager's original LDPC codes to the extent that the performance of these two code types is now comparable in Additive White Gaussian Noise (AWGN). The highly robust performance of LDPC codes in other types of channels such as partial-band jamming, quasi-static multi-input multi-output (MIMO) Rayleigh fading, fast MIMO Rayleigh fading, and periodic fading is evidenced in C. Jones, A. Matache, T. Tian, J. Villasenor and R. Wesel, "LDPC Codes—Universally Good for Wireless Channels, "Proceedings of the Military Communications Conference, October 2003," and C. Jones, T. Tian, A. Matache, R. Wesel and J. Villasenor, "Robustness of LDPC Codes on Periodic Fading Channels," Proceedings of GlobeCom, November 2002.

LDPC codes are commonly represented as a bipartite graph (see FIG. 1b). In the graph, one set of nodes, the variable nodes, correspond to the codeword symbols and another set, the constraint nodes, represent the constraints that the code places on the variable nodes in order for them to form a valid codeword.

Regular LDPC codes have bipartite graphs in which all nodes of the same type are of the same degree. A common example is the (3,6) regular LDPC code where all variable nodes have degree 3, and all constraint nodes have degree 6. The regularity of this code implies that the number of constraint nodes (which is the same as the number of parity check bits) equals exactly half the number of variable nodes such that the overall code is rate ½.

The parity check matrix H of a linear binary (n, k) systematic code has dimension (n–k)×n. The rows of H comprise the null space of the rows of the code's k×n generator matrix G. H can be written as, $$H=[H_1 H_2], \quad (1)$$

where $H_1$ is an (n–k)×k matrix and $H_2$ is an (n–k)×(n–k) matrix. $H_2$ is constructed to be invertible, so by row transformation through left multiplication with $H_2^{-1}$, we obtain a systematic parity check matrix $H_{sys}$ that is range equivalent to H, $$H_{sys}=H_2^{-1}H=[H_2^{-1}H_1 I_{n-k}]. \quad (2)$$

The left-hand portion of which can be used to define a null basis for the rows of H. Augmentation of the left-hand portion of the systematic parity check matrix $H_{sys}$ with $I_k$ yields the systematic generator matrix, $$G_{sys}=[I_k(H_2^{-1}H_1)^T]. \quad (3)$$

The rows of $G_{sys}$ span the codeword space such that $G_{sys}H^T=G_{sys}H_{sys}^T=0$. It should be noted that although the original H matrix is sparse, neither $H_{sys}$ nor $G_{sys}$ is sparse in general. $G_{sys}$ is used for encoding and the sparse parity matrix H is used for iterative decoding. A technique that manipulates H to obtain a nearly lower triangular form and allows essentially linear time (as opposed to the quadratic time due to a dense G matrix) encoding is available and was proposed by T. Richardson and R. Urbanke, "Efficient Encoding of Low Density Parity Check Codes," IEEE Trans. on Inform. Theory, vol. 47, pp. 638-656, February 2001.

The matrix and graph descriptions of an (n=9, k=3) code are shown in FIG. 1. Structures known as cycles, that affect decoding performance, are shown by (bold) solid lines in the figure. Although the relationship of graph topology to code performance in the case of a specific code is not fully understood, work exists in T. Tian, C. Jones, J. Villasenor and R. D. Wesel, "Characterization and Selective Avoidance of Cycles in Irregular LDPC Code Construction," International Conference on Communications (ICC) 2003 that investigates the effects of graph structures such as cycles, stopping sets, linear dependencies, and expanders.

II. REDUCING THE COMPLEXITY OF FULL-BP DECODING

A. The Approximate-Min*-BP Technique

Before describing the technique, we introduce notation that will be used in the remainder of this disclosure. On the variable node (left-hand) side of the bi-partite graph, u messages arrive and V messages depart. At the constraint node (right-hand) side of the graph v messages arrive and U messages depart. All four message types are actually log-likelihood ratios (LLRs). For instance, a message v arriving at a constraint node is actually a shorthand representation for $v=\ln(p(v=0)/p(v=1))$. The constraint node a-posteriori probability, or $U^{APP}$, is defined as the constraint node message determined by the $d_c$ variable messages that arrive at a constraint node of degree-$d_c$. The notation $U_j = U^{APP} \backslash v_j$ denotes the outgoing constraint message determined by all incoming edges with the exception of edge $v_j$. Message $v_j$ represents intrinsic information that is left purposefully absent in the extrinsic message computation $U_j = U^{APP} \backslash v_j$. Our algorithm (called Approximate-Min*-BP, or A-Min*-BP) updates constraint messages as follows, $$\text{initialize}\left\{v_{min} = \min_{j=1\ldots d_c}(|v_j|), \delta^0 = \infty\right\}$$

for $k = 1 \ldots d_c$ if$(k \ne \min)$ $\delta^k = |\Lambda^{BP*}(\delta^{k-1}, v_k)|$ else:

$\delta^k = \delta^{k-1}$ end $\delta^{APP/v_{min}} = \delta^{d_c}$ $\delta^{APP} = |\Lambda^{BP*}(\delta^{APP/v_{min}}, v_{min})|$ $\sigma^{APP} = \prod_{j=1}^{d_c} \text{sgn}(v_j)$ where $\delta^k$ is a storage variable, and $\Lambda^{BP*}$ will be defined shortly. Constraint message updates are found by applying the following additional operations on the above quantities.

$$U_j\Big|_{j=\{1\ldots d_c\}\backslash \min} = \text{sgn}(v_j)\text{sgn}(\sigma^{APP})\delta^{APP}$$

$$U_{min} = \text{sgn}(v_{min})\text{sgn}(\sigma^{APP})\delta^{APP/v_{min}}$$

The above constraint node update equations are novel and will be described in further detail. Variable node updating in our technique is the same as in the case of Full-BP. Extrinsic information is similarly described as before via $V_j = V^{APP} - u_j$, however the processing required to achieve these quantities is much simpler, $$V^{APP} = \sum_{j=0}^{d_v} u_j \quad V_j\Big|_{j=1\ldots d_v} = V^{APP} - u_j \qquad (4)$$

where $d_v$ is the variable node degree.

B. Derivation and Complexity of the A-Min*-BP Technique

Derivation of the Approximate-Min*-BP constraint node update begins with the so called 'Log-Hyperbolic-Tangent' definition of BP constraint updating. In the equation below, sign and magnitude are separable since the sign of LnTanh (x) is determined by the sign of x.

$$U^{APP} = \left[\prod_{j=1}^{d_c} \text{sgn}(v_j)\right] \ln\left(\frac{1+e^{-\sum_{j=1}^{d_c} \ln\left(\frac{1+e^{-|v_j|}}{1-e^{-|v_j|}}\right)}}{1-e^{-\sum_{j=1}^{d_c} \ln\left(\frac{1+e^{-|v_j|}}{1-e^{-|v_j|}}\right)}}\right). \qquad (5)$$

This equation is highly non-linear and warrants substantial simplification before mapping to hardware. To begin, the above computation can be performed by first considering the inner recursion in (5), $$\sum_{j=1}^{d_c} \ln\left(\frac{1+e^{-|v_j|}}{1-e^{-|v_j|}}\right). \qquad (6)$$

A total of $d_c$ table look-ups to the function $$\Lambda^{\ln BP} = \ln\left(\frac{1+e^{-|v_j|}}{1-e^{-|v_j|}}\right)$$

followed by $d_c - 1$ additions complete the computation in (6). Furthermore, the linearity of the inner recursion allows intrinsic variable values to be 'backed-out' of the total sum before $d_c$ outer recursions are used to form the $d_c$ extrinsic outputs. To summarize, computation of all $d_c$ extrinsic values (in (5)) follow from $d_c$ table look-ups, $d_c - 1$ additions, $d_c$ subtractions, and a final $d_c$ table look-ups. The cost of computing the extrinsic sign entails $d_c - 1$ exclusive-or operations to form the APP extrinsic sign, followed by $d_c$ incremental exclusive-or operations to back-out the appropriate intrinsic sign to form each final extrinsic sign.

Variable node computation (4) is more straightforward. However, a possible alternative to (4) is given in J. Chen, A. Dholakia, E. Eleftheriou, M. Fossorier, and X. Y. Hu, "Near Optimum Reduced-Complexity Decoding Algorithms for LDPC codes," Proc. IEEE Int. Sym. Inform. Theory, Lausanne, Switzerland, July 2002, where it is noted that codes lacking low degree variable nodes experience little performance loss due to the replacement of $V_j$ with $V^{APP}$. However, codes that maximize rate for a given noise variance in an AWGN channel generally have a large fraction of degree-2 and degree-3 variable nodes. Low degree nodes are substantially influenced by any edge input and $V^{APP}$ may differ significantly from corresponding properly computed extrinsic values. We have found experimentally that using $V^{APP}$ alone to decode capacity approaching codes degrades performance by one dB of SNR or more.

We continue toward the definition of an alternative constraint update recursion by rearranging (5) for the $d_c=2$ case, $$\text{sgn}(v_1)\text{sgn}(v_2)\ln\left(\frac{1+e^{|v_1|+|v_2|}}{e^{|v_1|}+e^{|v_2|}}\right) = \ln\left(\frac{1+e^{v_1+v_2}}{e^{v_1}+e^{v_2}}\right). \quad (7)$$

Two applications of the Jacobian logarithmic identity $(\ln(e^a+e^b)=\max(a,b)+\ln(1+e^{-|a-b|}))$ (see E. Eleftheriou, T. Mitteholzer and A. Dholakia, "A Reduced-Comlpexity Decoding Algorithm for Low Density Parity Check Codes, IEEE Electron. Letters, vol. 37, pp. 102-104, January 2001) result in the Min* recursion that is discussed in the rest of the disclosure, $$\Lambda^{BP*}(v_1, v_2) = \text{sgn}(v_1)\text{sgn}(v_2)\begin{pmatrix}\min(|v_1|,|v_2|)\\+\ln(1+e^{-(|v_1|+|v_2|)})\\-\ln(1+e^{-||v_1|-|v_2||})\end{pmatrix}. \quad (8)$$

Note that (8) is not an approximation. It is easy to show that $d_c-1$ recursions on $\Lambda^{BP*}$ yield exactly $U^{APP}$ in equation (5). Furthermore, the function $\ln(1+e^{-|x|})$ ranges over $(\ln(2), 0)$ which is substantially more manageable than the range of the function $$\Lambda^{LnBP}, \text{Range}\left(\ln\left(\frac{1+e^{-|x|}}{1-e^{-|x|}}\right)\right) = (\infty, 0)$$

from a numerical representation point of view. However, the non-linearity of the recursion (8) implies that updating all extrinsic information at a constraint node requires $d_c(d_c-1)$ calls to $\Lambda^{BP*}$. This rapidly becomes more complex than the $2d_c$ look-up operations (augmented with $2d_c-1$ additions) required to compute all extrinsic magnitudes based on the form in (5). Again, in this earlier case intrinsic values can be 'backed-out' of a single APP value to produce extrinsic values.

Instead of using the recursion in (8) to implement Full-BP we propose that this recursion be used to implement an approximate BP algorithm to be referred to as Approximate-Min*-BP (A-Min*-BP). The algorithm works by computing the proper extrinsic value for the minimum magnitude (least reliable) incoming constraint edge and assigning the $U^{APP}$ magnitude in conjunction with the proper extrinsic sign to all other edges.

To provide intuition as to why this hybrid algorithm yields good performance, note first that a constraint node represents a single linear equation and has a known 'solution' if no more than one input variable is unknown. Consider the following two scenarios. First, if a constraint has more than one unreliable input, then all extrinsic outputs are unreliable. Second, if a constraint has exactly one unreliable input, then this unknown input can be solved for based on the extrinsic reliability provided by the 'known' variables. In this second case all other extrinsic updates are unreliable due to the contribution of the unreliable input. The approximation in the suggested algorithm assigns less accurate magnitudes to would-be unreliable extrinsics, but for the least reliable input preserves exactly the extrinsic estimate that would be produced by Full-BP.

We next show that $U^{APP}$ always underestimates extrinsics. Here the notation $U_{mn}$ represents the extrinsic information that originates at constraint node m and excludes information from variable node n. Rearrangement of (5) (with standard intrinsic/extrinsic notation included—see J. Chen and M Fossorier, "Near Optimum Universal Belief Propagation Based Decoding of LDPC Codes," IEEE Trans. on Comm., vol, 50, no. 3, March 2002]) yields the following, $$|U^{APP}| = \ln\frac{1+\prod_{n' \in N(m)}\frac{1-e^{-|v_{mn'}|}}{1+e^{-|v_{mn'}|}}}{1-\prod_{n' \in N(m)}\frac{1-e^{-|v_{mn'}|}}{1+e^{-|v_{mn'}|}}} \quad (9)$$

$$\frac{1-e^{-|U^{APP}|}}{1+e^{-|U^{APP}|}} = \left(\prod_{n' \in N(m)/n}\frac{1-e^{-|v_{mn'}|}}{1+e^{-|v_{mn'}|}}\right)\left(\frac{1-e^{-|v_{mn}|}}{1+e^{-|v_{mn}|}}\right) \quad (10)$$

Note first that the function $$g(x) = \frac{1-e^{-|x|}}{1+e^{-|x|}}$$

(a product of which comprises the RHS of (10)) ranges over (0, 1) and is non-decreasing in the magnitude of x. The first (parenthesized) term on the right-hand side of (10) equals the extrinsic value $U_{mn}$ under the operator $g(\cdot)$, i.e., $g(U_{mn})$. The second term scales this value by the intrinsic reliability $g(v_{mn})$. Hence, the monotonicity and range of $g(x)$ ensure that $|U^{APP}|<|U_{mn}|$. We provide the inverse function, $$g^{-1}(x) = \ln\frac{1+x}{1-x},$$

for reference.

Underestimation in A-Min*-BP is curtailed by the fact that the minimum reliability $g(v_{min})$ dominates the overall product that forms $U^{APP}$. This term would have also been included in the outgoing extrinsic calculations used by Full-BP for all but the least reliable incoming edge. The outgoing reliability of the minimum incoming edge incurs no degradation due to underestimation since the proper extrinsic value is explicitly calculated. Outgoing messages to highly reliable incoming edges suffer little from underestimation since their corresponding intrinsic $g(v_{mn})$ values are close to one. The worst case underestimation occurs when two edges 'tie' for the lowest level of reliability. In this instance the dominant term in (10) is squared. An improved version of A-Min*-BP would calculate exact extrinsics for the two smallest incoming reliabilities.

However, the results in FIG. 2, where the algorithm (using floating point precision) is compared against Full-BP (using floating point precision) for short and medium length regular and irregular codes, indicate that explicit extrinsic calculation for only the minimum incoming edge is sufficient to yield performance that is essentially indistinguishable from that of Full-BP.

The proposed algorithm is relevant to the Offset-Min-BP algorithm of J. Chen and M Fossorier, "Density Evolution for BP-based decoding Algorithm of LDPC codes and their Quanitized Versions," Proc. IEEE Globecom, Taipai, Taiwan, November 2002, where the authors introduce a scaling factor to reduce the magnitude of extrinsic estimates produced by Min-BP. The Min-BP algorithm finds the magnitude of the two least reliable edges arriving at a given constraint node (which requires $d_c-1$ comparisons followed by an additional $d_c-2$ comparisons). The magnitude of the least reliable edge is assigned to all edges except the edge from which the least reliable magnitude came (which is assigned the second least reliable magnitude). For all outgoing edges, the proper extrinsic sign is calculated. As explained in J. Chen and M Fossorier, "Near Optimum Universal Belief Propagation Based Decoding of LDPC Codes," IEEE Trans. on Comm., vol, 50, no. 3, March 2002, these outgoing magnitudes overestimate the proper extrinsic magnitudes because the constraint node update equation follows a product rule (10) where each term lies in the range (0, 1). The Min-BP approximation omits all but one term in this product. To reduce the overestimation, an offset (or scaling factor) is introduced to decrease the magnitude of outgoing reliabilities. The authors in J Chen and M Fossorier, "Density Evolution for BP-based decoding Algorithm of LDPC codes and their Quanitized Versions," Proc. IEEE Globecom, Taipai, Taiwan, November 2002, use density evolution to optimize the offset for a given degree distribution and SNR. The optimization is sensitive to degree sequence selection and also exhibits SNR sensitivity to a lesser extent. Nevertheless, using optimized parameters, performance within 0.1 dB of Full-BP performance is possible.

By way of comparison, A-Min*-BP improves performance over Min-BP because the amount by which $U^{APP}$ underestimates a given extrinsic is less than the amount by which Min-BP overestimates the same extrinsic. Specifically, the former underestimates due to the inclusion of one extra term in the constraint node product while the latter overestimates due to the exclusion of all but one term in the product. A direct comparison to Offset-Min-BP is more difficult. However, a simple observation is that in comparison to Offset-Min-BP, A-Min*-BP is essentially 'self-tuning'.

The range and shape of the non-linear portion ($\Lambda^{BP}*$) of the A-Min*-BP computation are well approximated using a single, or at most a 2-line, piecewise linear fit, as shown in FIG. 4. All of the fixed precision numerical results to be presented in section III use the 2-line approximation (as do the floating point results in FIG. 2). Hence, the entire constraint node update is implemented using only shift and add computations, no look-ups to tables of non-linear function values are actually required.

The cost of constraint node updating for Full-BP (implemented using (5)), A-Min*-BP, and Offset-Min-BP are given in FIG. 5. The latter two algorithms have similar cost with the exception that $d_c-1$ table look-up operations in A-Min*-BP are replaced with $d_c$ additions in Offset-Min-BP (for offset adjustment). Note that use of a table is assumed for the representation of $\Lambda^{LnBP}$. While $\Lambda^{BP}*$ is well approximated using a two line piecewise fit employing power of 2 based coefficients. Variable node updating occurs via (4) for all three algorithms.

III. NUMERICAL IMPLEMENTATION

Minimum complexity implementation of the A-Min*-BP algorithm necessitates simulation of finite wordlength effects on edge metric storage (which dominates design complexity). Quantization selection consists of determining a total number of bits as well as the distribution of these bits between the integer and fractional parts (I,F) of the numerical representation. The primary objective is minimization of the total number of bits with the constraint that only a small performance degradation in the waterfall and error-floor BER regions is incurred. Quantization saturation levels (Sat=$2^I$) that are too small cause the decoder to exhibit premature error-floor behavior. We have not analytically characterized the mechanism by which this occurs. However, the following provides a rule of thumb for the saturation level, $$\text{Sat} = -\ln(p) \approx \ln\left(\frac{1-p}{p}\right) \text{ where } p = e^{-Sat}.$$

This allows literal Log-Likelihood Ratio (LLR) representation of error probabilities that are as small as p. In practice, this rule seems to allow the error-floor to extend to a level that is about one order of magnitude lower than p.

In the results that follow, simple uniform quantization has been employed, where the step size is given by $2^{-F}$. To begin, FIG. 3 shows that low SNR performance is less sensitive to quantization than high SNR performance. A small but noticeable degradation occurs when 2 rather than 3 fractional bits are used to store edge metrics and 4 integer bits are used in both cases. In summary, 7 bits of precision (Sign, 4 Integer, 2 Fractional) are adequate for the representation of observation and edge metric storage in association with the considered code.

When power of 2 based quantization is used, the negative and positive saturation levels follow $\lfloor -2^{I-1}, 2^{I-1}-2^{-F} \rfloor$. An alternative approach arbitrarily sets this range between a maximum and a minimum threshold and sets the step size equal to $s=2*\text{MaxRange}/2^{TotalBits}$. This approach to quantization is more general than the previous since the step size is not limited to powers of 2. We have found that in the low SNR regime, smaller quantization ranges are adequate, but the optimal step size remains similar to that needed at higher SNRs. Thus, operation at lower SNRs requires fewer overall bits given the general range approach to quantization. For example for $E_b/N_o=1.0$ dB, when MaxRange=10 and a total of 6 bits were used, no performance degradation was observed. For higher SNR values, MaxRange=16 was the best choice. This agrees with the results obtained using binary quantization with (I, F)=(4, 2). The performance of this quantizer is described in FIG. 3 by the curve labeled '6 bit G.R.' (or 6 bit general range) where in this case the range is set equal to (−10,10)@1.0 dB;(−12,12)@1.2 dB;(−16, 16)@1.4 dB and a total of 6 bits (1 sign, 5 quant-bits) is used. Hence in this case the general range quantizer is equivalent to the (1,4,1) power of 2 quantizer at high SNR. At lower SNRs, the best case range was smaller than (−16,16) such that general range quantization offers an added degree of freedom in precision allocation that is useful in the context of LDPC decoding.

IV. THE UCLA LDPC CODEC

We have implemented the above constraint update technique along with many other necessary functions in order to create a high throughput Monte Carlo simulation for arbitrary LDPC codes. The design runs on a VirtexII evaluation board and is interfaced to a PC via a JAVA API. A high level block diagram of the circuitry implemented in the decoder is provided in FIG. 6. The Gaussian noise generator developed by the authors in L. Dong-U, J. Villasenor, and W. Luk, "A Hardware Gaussian Noise Generator For Exploring Channel Code Behavior At Very Low Bit Error Rates," In Proceedings of FCCM, May 2003, is instantiated next to the decoder so as to avoid a noise generation bottleneck. This block directly impacts the overall value of the system as a Monte Carlo simulator for error-floor testing as good noise quality at high SNR (tails of the Gaussian) is essential. Since the LDPC decoding process is iterative and the number of required iterations is non-deterministic, a flow control buffer can be used to greatly increase the throughput of the overall system.

Through the use of JAVA as a soft interface to the board, we have been able to facilitate the initiation and monitoring of simulations from remote locations. A higher level view of the overall system is given in FIG. 7 where the contents of FIG. 6 have been abstracted to the block labeled 'LDPC Decoder FPGA'. The figure displays all major elements of the LDPC decoder prototype. Specifically, the PC-Host which interfaces to a Field-Programmable Gate Array (FPGA) Printed Circuit Board (PCB) via a Peripheral Component Interconnect (PCI) Bus. The FPGA PCB supports both a PCI interface FPGA and the design FPGA (where the present invention is prototyped). The design FPGA can be clocked at up to 100 MHz and has been used to demonstrate all aspects of the decoding procedure described in the present invention.

FIG. 8 provides a flow chart of one embodiment of a method for decoding according to the present invention. Step 102 of FIG. 8 includes receiving a set of arrived edges, where the edges are bits of a code word and the edges each have a magnitude as well as a sign. A minimum edge of the set of arrived edges is identified in step 104. In step 106, a first function is performed on each edge of the set of arrived edges that are not the minimum edge. The first function selects a minimum value between an edge under consideration and a previous result of the function. In one embodiment, the minimum edge is adjusted by a correction factor. In step 108, a first result of the first function is stored, after the step of performing a first function on each edge. The first result does not include a contribution due to the minimum edge. In step 110, the first function is performed again with the minimum edge and the first result as the inputs to the first function. In step 112, an aggregate sign is determined for the set of arrived edges. In step 114, new magnitudes and signs are computed, and stored for the set of arrived edges. The minimum edge receives a magnitude based on the first function without including the contribution due to the minimum edge.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A machine implemented method for message handling during decoding, comprising:
    identifying a minimum edge of a set of edges associated with a constraint node;
    performing a first function on each edge of said set of edges that are not said minimum edge, said performing said first function includes adjusting a result by a cumulative correction factor, said performing said first function on each edge of said set of edges that are not said minimum edge provides a first result;
    performing said first function with inputs to said first function being based on said minimum edge and said first result, said performing said first function with inputs to said first function being based on said minimum edge and said first result provides a second result;
    assigning a first magnitude to said minimum edge based on said first result;
    assigning a second magnitude to edges that are not said minimum edge based on said second result; and
    decoding said code word using said steps of identifying a minimum edge, performing said first function on each edge of said set of edges that are not said minimum edge, performing said first function with inputs to said first function being based on said minimum edge and said first result, assigning a first magnitude and assigning a second magnitude.

2. A machine implemented method according to claim 1, wherein:
    said first function selects a minimum value between an edge under consideration and a previous result and applies said cumulative correction factor.

3. A machine implemented method according to claim 2, wherein said cumulative correction factor includes:
    $+\ln(1+e^{-(|v1|+|v2|)})-\ln(1+e^{-(|v1|-|v2|)})$ where v1 and v2 are inputs to said first function.

4. A machine implemented method according to claim 1, wherein:
    said first result does not include a contribution from said minimum edge.

5. A machine implemented method according to claim 1, further comprising:
    determining an aggregate sign for set of edges; and
    assigning said sign to set of edges.

6. A machine implemented method according to claim 1, wherein:
    said set of edges correspond to a code word being decoded.

7. A machine implemented method according to claim 1, wherein:
    said steps of identifying a minimum edge, performing said first function on each edge of said set of edges that are not said minimum edge, performing said first function with inputs to said first function being based on said minimum edge and said first result, assigning a first magnitude and assigning a second magnitude are performed iteratively to decode a code word.

8. A machine implemented method according to claim 1, wherein:
    said steps of identifying a minimum edge, performing said first function on each edge of said set of edges that are not said minimum edge, performing said first function with inputs to said first function being based on said minimum edge and said first result, assigning a first magnitude and assigning a second magnitude are performed as part of a belief propagation process.

9. A machine implemented method according to claim 1, wherein:
said steps of assigning a first magnitude and assigning a second magnitude provide constraint message updates.

10. A machine implemented method according to claim 1, wherein:
said first function selects a minimum value between an edge under consideration and a previous result and applies said cumulative correction factor;
said first result does not include a contribution from said minimum edge;
said method further includes determining an aggregate sign for set of edges and assigning said sign to set of edges;
said set if edges correspond to a code word being decoded; and
said steps of identifying a minimum edge, performing said first function on each edge of said set of arrived edges that are not said minimum edge, performing said first function with inputs to said first function being based on said minimum edge and said first result, assigning a first magnitude and assigning a second magnitude are performed as part of a belief propagation process.

11. A machine implemented method according to claim 10, wherein:
said steps of identifying a minimum edge, performing said first function on each edge of said set of edges that are not said minimum edge, performing said first function with inputs to said first function being based on said minimum edge and said first result, assigning a first magnitude and assigning a second magnitude are performed iteratively to decode said code word.

12. A machine implemented method for message handling during decoding, comprising:
accessing information corresponding to a set of edges for a constraint node;
computing a first magnitude using a first function on a subset of said information without including a contribution due to a minimum edge, said first function includes a variable correction factor based on previous values of said first function;
computing a second magnitude using said first function based on contributions due to said minimum edge and other edges of said set of edges; and
associating said first magnitude with said minimum edge;
assigning said second magnitude with edges of said set of edges that are not said minimum edge; and
decoding said code word including correcting a problem associated with said code word, said steps of accessing information, computing said first magnitude, computing said second magnitude, assigning said first magnitude and assigning said second magnitude are performed iteratively to decode said code word.

13. A machine implemented method according to claim 12, wherein:
said first function selects a minimum value between an edge under consideration and a previous result and applies said cumulative correction factor.

14. A machine implemented method according to claim 12, further comprising:
determining an aggregate sign for set of edges; and
assigning said sign to set of edges.

15. A machine implemented method according to claim 12, wherein:
said steps of accessing information, computing said first magnitude, computing said second magnitude, assigning said first magnitude and assigning said second magnitude are performed as part of a belief propagation process.

16. An apparatus that performs message handling during decoding, comprising:
a circuit, said circuit accesses a set of edges for a constraint node, said edges correspond to a code word, said edges have magnitudes, said circuit computes and assigns a set of unique magnitudes for said set of edges, said set of unique magnitudes are computed based on said set of edges and using a first function that includes a cumulative correction factor, said set of unique magnitudes includes less magnitudes than edges in said set of edges; and
an interface for said circuit.

17. An apparatus according to claim 16, wherein:
said circuit computes and assigns by computing two unique magnitudes for said edges using said first function, assigning a first magnitude of said two unique magnitudes to a minimum edge of said set of edges and assigning a second magnitude of said two unique magnitudes to edges of said set of edges that are not said minimum edge.

18. An apparatus according to claim 16, wherein:
said first function selects a minimum value between an edge under consideration and a previous result and applies said cumulative correction factor.

19. An apparatus according to claim 18, wherein:
said circuit assigns a sign to set of edges.

20. An apparatus according to claim 19, wherein:
said circuit accesses said set of edges and computes and assigns said set of unique magnitudes iteratively to decode a code word.

21. An apparatus according to claim 20, wherein:
said circuit performs a belief propagation process.

22. One or more processor readable storage devices having code embodied on said processor readable storage devices, said code for programming one or more processors to perform a method comprising:
identifying a minimum edge of a set of edges associated with a constraint node;
performing a first function on each edge of said set of edges that are not said minimum edge, said performing said first function includes adjusting a result by a cumulative correction factor, said performing said first function on each edge of said set of edges that are not said minimum edge provides a first result;
performing said first function with inputs to said first function being based on said minimum edge and said first result, said performing said first function with inputs to said first function being based on said minimum edge and said first result provides a second result;
assigning a first magnitude to said minimum edge based on said first result; and
assigning a second magnitude to edges that are not said minimum edge based on said second result.

23. One or more processor readable storage devices according to claim 22, wherein:
said steps of identifying a minimum edge, performing said first function on each edge of said set of edges that are not said minimum edge, performing said first function with inputs to said first function being based on said minimum edge and said first result, assigning a first magnitude and assigning a second magnitude are performed as part of a belief propagation process.

24. One or more processor readable storage devices according to claim 22, wherein said cumulative correction factor includes:

$+\ln(1+e^{-(|v1|+|v2|)})-\ln(1+e^{-(|v1|-|v2|)})$, where v1 and v2 are inputs to said first function.

25. One or more processor readable storage devices according to claim 22, wherein:

said first function selects a minimum value between an edge under consideration and a previous result and applies said cumulative correction factor.

26. One or more processor readable storage devices according to claim 22, wherein:

said first result does not include a contribution from said minimum edge.

27. One or more processor readable storage devices according to claim 22, wherein:

said identifying a minimum edge, performing said first function on each edge of said set of edges that are not said minimum edge, performing said first function with inputs to said first function being based on said minimum edge and said first result, assigning a first magnitude and assigning a second magnitude are performed iteratively to decode a code word.

* * * * *